US006391519B1

(12) United States Patent
Kunita

(10) Patent No.: US 6,391,519 B1
(45) Date of Patent: May 21, 2002

(54) PHOTOSENSITIVE RESIN COMPOSITION, IMAGE RECORDING MATERIAL, AND PLANOGRAPHIC PRINTING PLATE USING THE SAME

(75) Inventor: Kazuto Kunita, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/362,882

(22) Filed: Jul. 29, 1999

(30) Foreign Application Priority Data

Aug. 24, 1998 (JP) .......................................... 10-237752
Aug. 28, 1998 (JP) .......................................... 10-243478

(51) Int. Cl.[7] ............................................... G03F 7/004
(52) U.S. Cl. .................................... 430/270.1; 430/302
(58) Field of Search ............................. 430/270.1, 302, 430/281.1, 286.1

(56) References Cited

U.S. PATENT DOCUMENTS

| | | | | | |
|---|---|---|---|---|---|
| 4,306,011 | A | * | 12/1981 | Uehara et al. | 430/190 |
| 4,536,465 | A | * | 8/1985 | Uehara et al. | 430/192 |
| 4,708,925 | A | | 11/1987 | Newman | 430/270 |
| 5,002,851 | A | * | 3/1991 | Toukhy | 430/192 |
| 5,019,479 | A | * | 5/1991 | Oka et al. | 430/172 |
| 5,338,643 | A | * | 8/1994 | Kanazawa et al. | 430/190 |
| 5,641,608 | A | | 6/1997 | Grunwald et al. | 430/302 |
| 5,705,308 | A | * | 1/1998 | West et al. | 430/165 |
| 5,827,634 | A | * | 10/1998 | Thackeray et al. | 430/270.1 |
| 5,879,852 | A | * | 3/1999 | Eichhorn et al. | 430/157 |
| 6,060,217 | A | * | 5/2000 | Nguyen et al. | 430/302 |
| 6,083,658 | A | * | 7/2000 | Kunita et al. | 430/270.1 |
| 6,117,610 | A | * | 9/2000 | Sheriff et al. | 430/190 |
| 6,132,929 | A | * | 10/2000 | Nakamura et al. | 430/270.1 |
| 6,214,518 | B1 | * | 4/2001 | Kunita et al. | 430/270.1 |
| 6,238,829 | B1 | * | 5/2001 | Tomita et al. | 430/278.1 |

FOREIGN PATENT DOCUMENTS

| | | | | |
|---|---|---|---|---|
| EP | 0874282 | A1 | | 10/1998 |
| EP | 1 072 432 | A2 | * | 1/2001 |
| EP | 1 120 246 | A2 | * | 8/2001 |
| JP | 8-276558 | | | 10/1996 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

An image recording material or photosensitive resin composition comprising:

(A-1) a phenolic polymer having a structural unit represented by the following general formula I-(1) on a polymer backbone;

(A-2) a polymer which has a structural unit represented by the following general formula II-(1) as a polymer backbone or a structural unit represented by the following general formula II-(2) as a side chain attached to a polymer backbone and which has a phenolic hydroxyl group; or (A-3) a mixture comprising a polymer having a phenolic hydroxyl group and a polymer which has a structural unit represented by the following general formula II-(1) as a polymer backbone or a structural unit represented by the following general formula II-(2) as a side chain of attached to a polymer backbone; and (B) an infrared ray absorbing agent. A planographic printing plates using the above-described image recording material and photosensitive resin composition is also provided

I-(1)

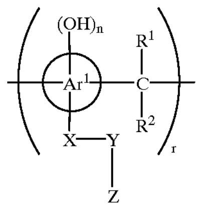

II-(1)

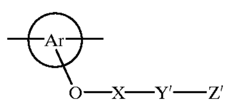

II-(2)

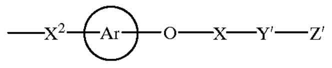

10 Claims, No Drawings

PHOTOSENSITIVE RESIN COMPOSITION, IMAGE RECORDING MATERIAL, AND PLANOGRAPHIC PRINTING PLATE USING THE SAME

BACKGROUND OF THE INVENTION

1. Field of the Invention

The present invention relates to a photosensitive resin composition or image recording material which can be used as a material for a planographic printing plate, a color proof, a photoresist, or a color filter and also to a planographic printing plate using the photosensitive resin composition or image recording material. More specifically, the present invention relates to a negative- or positive-type photosensitive resin composition or image recording material which can be used as a material for a planographic printing plate in a so-called direct plate making process in which the material can be directly inscribed by scanning an infrared laser according to digital signals from a computer or the like. Further, the present invention relates to a planographic printing plate using the photosensitive resin composition and image recording material.

2. Description of the Related Art

Owing to the remarkable developments in lasers in recent years, solid state lasers and semiconductor lasers (hereinafter, occasionally referred to as “infrared lasers”) devices, which emit infrared rays mainly in a wavelength range of from 760 to 1200 nm and have a high output power in spite of their small size, have become easily available. These infrared lasers are extremely effective as recording light sources in a direct plate making process in which a material for the printing plate is directly inscribed using digital data from a computer or the like. Accordingly in recent years, there has been a growing demand for a photosensitive resin composition or image recording material, which is highly sensitive to these infrared recording light sources, namely for a photosensitive resin composition or image recording material which causes a photochemical reaction or the like when irradiated with infrared rays and whose solubility in a developing solution largely changes.

An example of the photosensitive resin composition or image recording material which can be recorded by such an infrared laser is the composition or recording material which is disclosed in U.S. Pat. No. 4,708,925 and which is composed of an onium salt, a phenolic resin, and a spectral sensitizer. This composition or recording material is a positive-type image recording material which uses the onium salt component and the phenolic resin component to inhibit dissolution in a developing solution.

On the other hand, an example of a negative-type image recording material is disclosed in Japanese Patent Application Laid-Open (JP-A) No. 8-276,558. This recording material comprises a substance which absorbs light to generate heat, an alkali-soluble resin, and a specific phenol derivative which has 4–8 benzene rings in the molecule.

However, none of these photosensitive resin compositions and image recording materials had sufficient sensitivity to laser exposure. Despite various attempts thitherto made to increase the sensitivity of these recording materials, generally, any steps taken to increase the sensitivity of these recording materials tended to impair the storage stability of the recording materials. In particular, poor storage stability under high humidity conditions presented a problem.

SUMMARY OF THE INVENTION

An object of the present invention is to provide a photosensitive resin composition or image recording material which can be directly inscribed using an infrared ray emitting solid state laser or semiconductor laser according to digital data from a computer or the like and which has a high sensitivity to the infrared laser and superior storage stability under highly humid conditions. Another object of the present invention is to provide a planographic printing plate using the photosensitive resin compositions or image recording materials.

The present inventors have conducted intense studies of the components of a photosensitive resin composition or recording material which can be directly inscribed by scanning using an infrared ray. As a result, they have found that the use as a binder polymer of a phenolic polymer which has on a polymer main chain a structural unit represented by the following general formula I-(1) having a specific functional group and has a molecular weight of 1000 or more makes it possible to increase the film density of the photosensitive film of the image recording material since the specific functional group strongly interacts with an adjacent phenolic hydroxyl group in the binder.

Accordingly, the above-mentioned objects can be achieved by the following image recording material and by a planographic printing plate using the image recording material.

The image recording material of the present invention comprises (a) a phenolic polymer, which has on a polymer main chain a structural unit represented by the following general formula I-(1) and has a molecular weight of 1000 or more, and (b) an infrared ray absorbing agent,

I-(1)

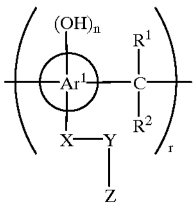

wherein $Ar^1$ represents an aromatic hydrocarbon ring which may have a substituent group; $R^1$ and $R^2$ may be the same or different and each represents a hydrogen atom or a hydrocarbon group having 12 or less carbon atoms; n is an integer of 1 to 3; r is an integer chosen in accordance with the molecular weight; X represents a divalent linking group; Y represents either a di- to quadrivalent linking group having at least one partial structure selected from the following $Y^1$ groups or a terminal group terminated with a hydrogen atom; and Z is absent when Y is a terminal group, but Z represents either a mono- to quadrivalent linking group or a terminal group when Y is a linking group.

$Y^1$:

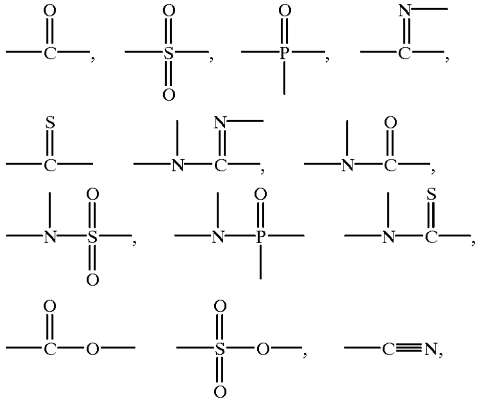

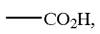

and

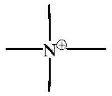

The planographic printing plate of the present invention comprises a substrate having thereon a photosensitive layer composed of the above-described image recording layer.

Where the image recording material and the planographic printing plate using the image recording material are of a negative type, they comprise a compound (c) cross-linkable by the action of an acid and a compound (d) which generates an acid by the action of heat in addition to the above-described components.

Where the image recording material and the planographic printing plate using the image recording material are of a positive type, an onium-type infrared ray absorbing agent is suitably used as an infrared ray absorbing agent (b).

As another aspect of the invention, the present inventors have found that the use as a binder polymer of a polymer (a), which has a structural unit in which the hydrogen atom of a phenolic hydroxyl group is substituted with a specific functional group —X—Y'—Z', namely a polymer having at least the structural unit represented by the general formula II-(1) or the structural unit represented by the general formula II-(2) and further a phenolic hydroxyl group, makes it possible to increase the film density of the photosensitive film of the photosensitive resin composition since the specific functional group strongly interacts with an adjacent phenolic hydroxyl group in the binder.

Accordingly, the above-mentioned objects can be achieved by the following photosensitive resin compositions [A] to [D] and planographic printing plates.

The photosensitive resin composition [A] of the present invention comprises a polymer which has at least a structural unit represented by the following general formula II-(1) as a polymer backbone or a structural unit represented by the following general formula II-(2) as a side chain linked to a polymer backbone and further a phenolic hydroxyl group,

II-(1)

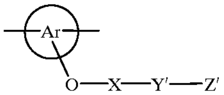

II-(2)

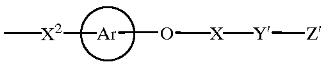

wherein Ar represents an aromatic hydrocarbon ring which may have a substituent group; X represents a divalent linking group; Y' represents a divalent linking group having at least one partial structure selected from the following $Y'^1$ groups; Z' represents a monovalent terminal group; and $X^2$ represents a single bond or a divalent linking group which contains one or more atoms selected from C, H, N, O, and S and which has 20 or less carbon atoms.

$Y'^1$:

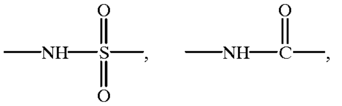

and

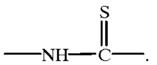

The photosensitive resin composition [B] of the present invention comprises a polymer, which has at least a structural unit represented by the following general formula II-(1) as a polymer backbone or a structural unit represented by the following general formula II-(2) as a side chain linked to a polymer backbone, and a polymer which has a phenolic hydroxyl group.

The photosensitive resin compositions of the present invention [C] and [D] further comprise an infrared ray absorbing agent (b) in addition to the photosensitive resin compositions [A] and [B], respectively.

The planographic printing plate of the present invention comprises a substrate having thereon a photosensitive layer composed of any one selected from the photosensitive resin compositions [A] to [D].

Where the image recording material and planographic printing plate using the image recording material are of a negative type, they comprise a compound (c) cross-linkable by the action of an acid and a compound (d) which generates an acid by the action of heat in addition to the above-described components.

Where the image recording material and the planographic printing plate using the image recording material are of a positive type, an onium-type infrared ray absorbing agent is suitably used as an infrared ray absorbing agent (b).

DETAILED DESCRIPTION OF THE PREFERRED EMBODIMENTS

The photosensitive composition or image recording material of the present invention and the planographic printing plate using the photosensitive composition or image recording material of the present invention will now be explained in more detail.

[(a) A Phenolic Polymer which has on a Polymer Main Chain a Structural Unit Represented by the General Formula I-(1)]

The image recording material of the present invention uses as a polymer material for a binder a phenolic polymer which has on a polymer main chain a structural unit represented by the above general formula I-(1) and has a molecular weight of 1000 or more (and hereinafter may simply be referred to as "phenolic polymer"). This phenolic polymer is a novolak-type polymeric compound having on a main and/or side chain a structural unit derived from a phenolic structure having a specific —X—Y—Z functional group (a compound having this structure may simply be referred to as a "phenolic compound" hereinafter).

In the general formula I-(1), $Ar^1$ represents an aromatic hydrocarbon ring which may have a substituent group. Because of the availability thereof as a raw material, the aromatic hydrocarbon ring is preferably a benzene ring, a naphthalene ring, or an anthracene ring. Examples of preferable substituent groups may include a halogen atom, an alkyl group having 12 or less carbon atoms, an alkoxy group, an alkylthio group, a cyano group, a nitro group, and a trifluoromethyl group. In view of the high sensitivity thereof, particularly preferable is a benzene or naphthalene ring, which may or may not have a substituent group. When the benzene or naphthalene ring has a substituent group, particularly preferable as the substituent are a halogen atom, an alkyl group having 6 or less carbon atoms, an alkoxy group, an alkylthio group, and a nitro group.

$R^1$ and $R^2$ may be the same or different and each represent a hydrogen atom or a hydrocarbon group having 12 or less carbon atoms. Because of the ease with which the compound is synthesized, it is preferable that $R^1$ and $R^2$ are each a hydrogen atom or a methyl group.

Moreover, in the general formula I-(1), n is an integer of from 1 to 3 so that n units of hydroxyl groups are positioned on any site in $A^1$; and r is an integer selected in accordance with the molecular weight.

In the general formula I-(1), X represents a divalent linking group; Y represents either a di- to quadrivalent linking group having at least one partial structure selected from the aforesaid $Y^1$ groups or a terminal group terminated with a hydrogen atom; and Z is absent when Y is a terminal group, but Z represents either a mono- to quadrivalent linking group or a terminal group when Y is a linking group.

Details of X in the general formula I-(1) are given below.

As stated previously, X represents a divalent linking group. More specifically, X represents a single bond or a divalent hydrocarbon linking group which may have a substituent group. Preferable as the hydrocarbon linking group are a linear alkylene group having 1 to 18 carbon atoms, a linear, branched, or cyclic group having 2 to 18 carbon atoms, an alkynylene group having 2 to 8 carbon atoms, and an arylene group having 6 to 20 carbon atoms.

Specific examples of X may include a methylene group, an ethylene group, a propylene group, a butylene group, an isopropylene group, a cyclohexylene group, a phenylene group, a tolylene group, and a biphenylene group. Among these groups, the groups represented by the following structures are particularly preferable.

—CH═CH—, —CH═CH—CH═CH—,

-continued

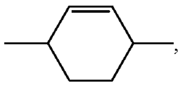, —C≡C—

When these linking groups have substituent groups, examples of preferable substituent groups may include an alkoxy group having 12 or less carbon atoms, a halogen atom, and a hydroxyl group.

Details of Y in the general formula I-(1) are given below.

Y represents either a linking group linked to Z described later or a terminal group terminated with a hydrogen atom. When Y represents a linking group, the group may be of any valence between divalent and quadrivalent and is a group known to produce a strong interaction with a phenolic hydroxyl group. More specifically, Y has any of the following partial structures.

$Y^1$:

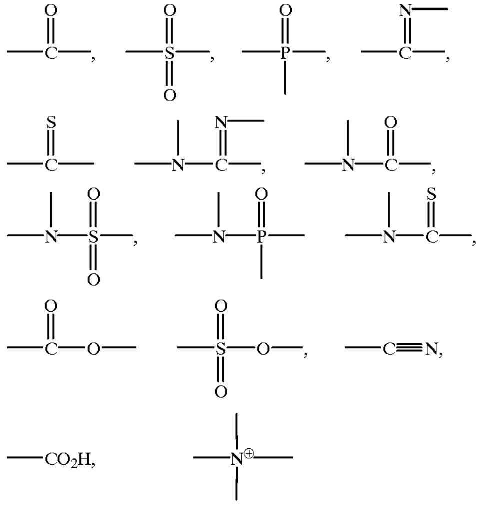

"Y has the following partial structure" means that Y, which is a linking group or a terminal group, has at least one of the partial structures listed above. Therefore, Y may have a plurality of these partial structures. Accordingly, Y may be a partial structure itself selected from the $Y^1$ groups, a group comprising a plurality of these partial structures linked together, or a group comprising any of these partial structures and other hydrocarbon groups linked together.

Particularly, in the general formula I-(1), specific examples of preferable compounds having the above-described partial structure may include amides, sulfonamides, imides, ureas, urethanes, thioureas, carboxylic acids, carboxylate esters, and sulfonate esters.

Details of Z in the general formula I-(1) are given below.

Z is absent when Y is a terminal group, but Z represents either a mono- to quadrivalent linking group or a terminal group when Y is a linking group. Where Z is divalent or greater, the remaining 1 to 3 bonds of Z are linked to Y in other structural units which are represented by the general formula I-(1) and constitute the phenolic polymer. Thus, these may be 1 to 3 linkages between 2 and Y. That is, a state where Z is owned jointly by these structural units, namely a cross-linked state, is created.

Preferably, Z is a hydrocarbon-based linking group which may have a substituent group. Preferable as the hydrocarbon-based linking group are a linear, branched, or cyclic alkylene or alkyl group having 1 to 18 carbon atoms; an arylene or aryl groups having 6 to 20 carbon atoms; a linear, branched, or cyclic alkenylene or alkenyl group having 2 to 18 carbon atoms; and a linear, branched, or cyclic alkynylene or alkynyl group having 2 to 18 carbon atoms.

Where Z is monovalent, specific examples of preferable Z may include a methyl group, an ethyl group, a propyl group, an isopropyl group, a butyl group, an isobutyl group, a tertiary butyl group, a secondary butyl group, a pentyl group, a hexyl group, a cyclopentyl group, a cyclohexyl group, an octyl group, a benzyl group, a phenyl group, a naphthyl group, an anthracenyl group, an allyl group, and a vinyl group.

Where Z is divalent or greater, preferable as Z are the groups which result from the above-mentioned monovalent groups by eliminating therefrom hydrogen atoms in numbers corresponding to the valence.

Where Z has a substituent group, examples of preferable substituent groups may include an alkoxy group having 12 or less carbon atoms, a halogen atom, and a hydroxyl group.

The phenolic polymer, which is suitably used in the image recording material of the present invention and which has on a main chain the structural unit represented by the general formula I-(1), is synthesized, for example, by a dehydrating polycondensation from a phenol compound Z—Y—X—($Ar^1$)—$(OH)_n$ and a carbonyl compound. Specific examples of the phenol compounds may include, but are not limited to, the following compounds.

TABLE 1

A type

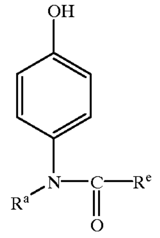

| | $R^a$ | $R^e$ |
|---|---|---|
| (A-1) | H | H |
| (A-2) | H | $CH_3$ |
| (A-3) | H | $C_2H_5$ |
| (A-4) | H | $^iPr$ |
| (A-5) | H | $^tBu$ |
| (A-6) | H | Ph |
| (A-7) | $CH_3$ | $CH_3$ |
| (A-8) | $CH_3$ | $^iPr$ |
| (A-9) | $CH_3$ | Ph |
| (A-10) | Ph | $CH_3$ |
| (A-11) | Ph | $^iPr$ |

TABLE 2

B type

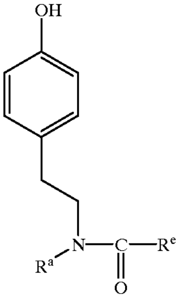

| | $R^a$ | $R^e$ |
|---|---|---|
| (B-1) | H | $C_2H_5$ |
| (B-2) | H | $^iPr$ |
| (B-3) | H | $^nBu$ |
| (B-4) | H | $^tBu$ |
| (B-5) | H | Ph |

TABLE 3

C type

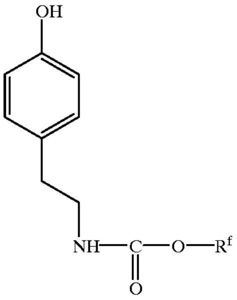

| | $R^f$ |
|---|---|
| (C-1) | $C_2H_5$ |
| (C-2) | $^iPr$ |
| (C-3) | $^nBu$ |
| (C-4) | Ph |
| (C-5) | —$CH_2$—Ph |

TABLE 4

D type

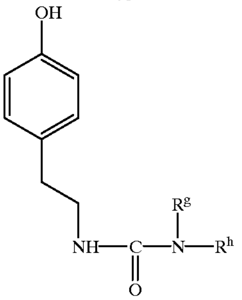

| | $R^g$ | $R^h$ |
|---|---|---|
| (D-1) | H | $^nBu$ |
| (D-2) | H | cyclo-$C_6H_{11}$ |
| (D-3) | H | Ph |

TABLE 4-continued
D type
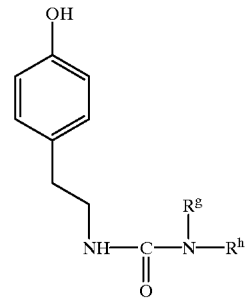
| | $R^g$ | $R^h$ |
|---|---|---|
| (D-4) | H | 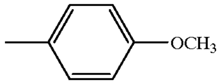 |
| (D-5) | H | 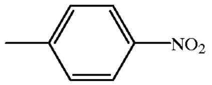 |
| (D-6) | $CH_3$ | $CH_3$ |
TABLE 5
E type
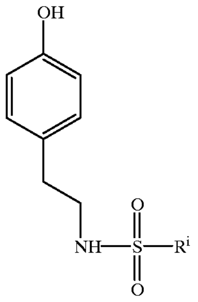
| | $R^i$ |
|---|---|
| (E-1) | $C_2H_5$ |
| (E-2) | Ph |
| (E-3) | 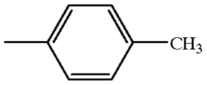 |
| (E-4) | 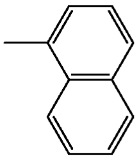 |
TABLE 6
F type
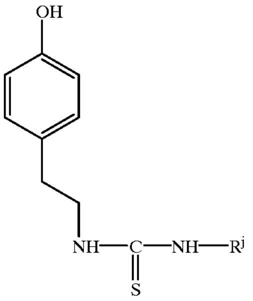
| | $R^j$ |
|---|---|
| (F-1) | $CH_2—CH{=}CH_2$ |
| (F-2) | $^{n}Bu$ |
| (F-3) | Ph |
TABLE 7
G type
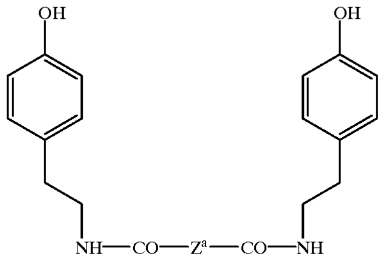
| | $Z^a$ |
|---|---|
| (G-1) | $—(CH_2)_4—$ |
| (G-2) | 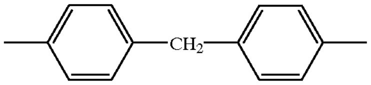 |
| (G-3) | 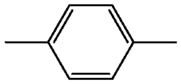 |
| (G-4) | $—NH—(CH_2)_6—NH—$ |
| (G-5) | 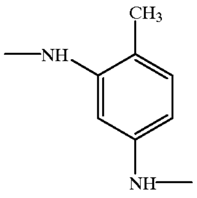 |
| (G-6) | 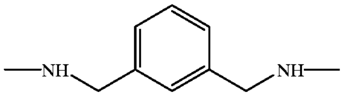 |
| (G-7) | $—O—(CH_2)_6—O—$ |
| (G-8) | 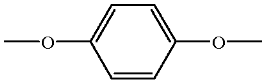 |

TABLE 8
| | |
|---|---|
| H type | |
| 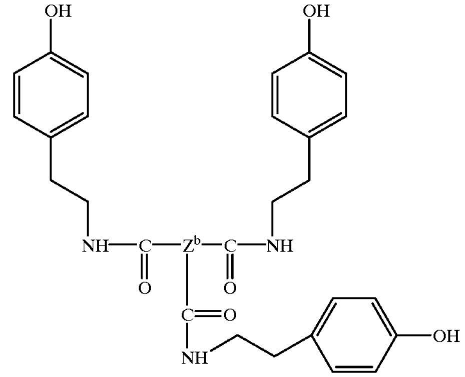 | |
| | $Z^b$ |
| (H-1) | 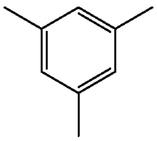 |
| (H-2) | 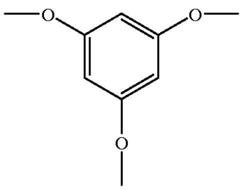 |
| (H-3) | 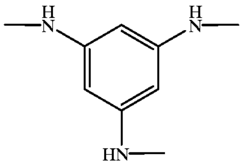 |
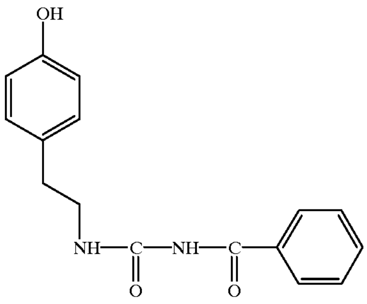
(S-1)
-continued
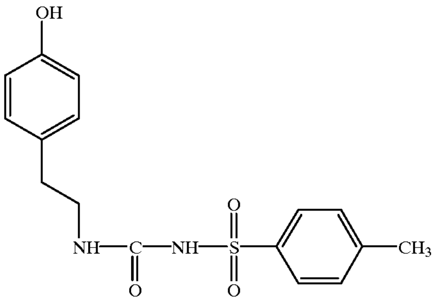
(S-2)
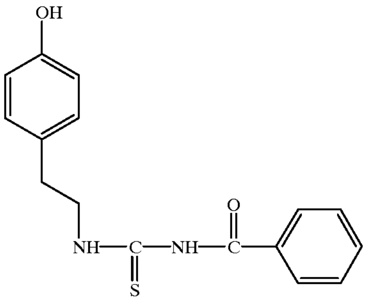
(S-3)
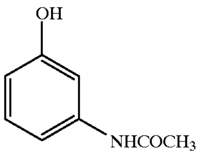
(S-4)
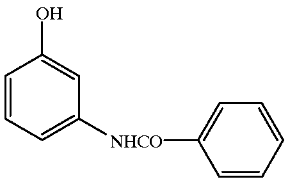
(S-5)
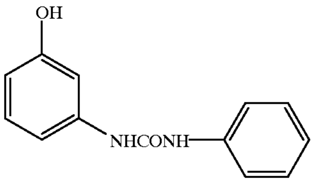
(S-6)
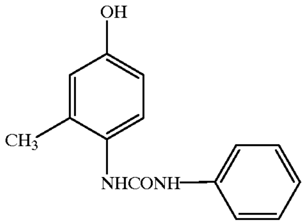
(S-7)

-continued
(S-8)
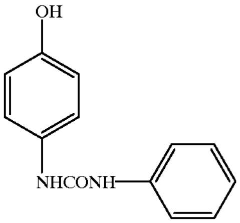
(S-9)
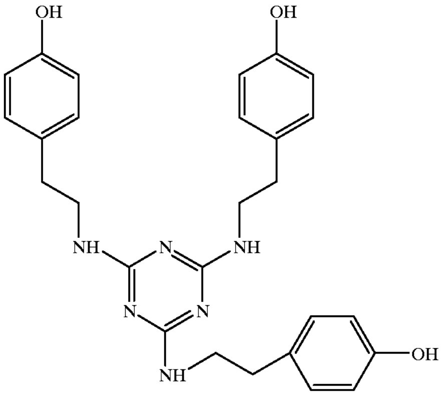
(S-10)
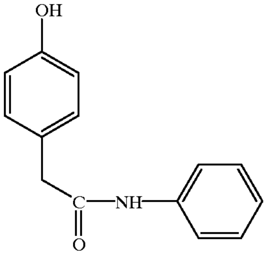
(S-11)
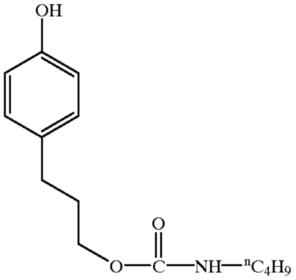
(S-12)
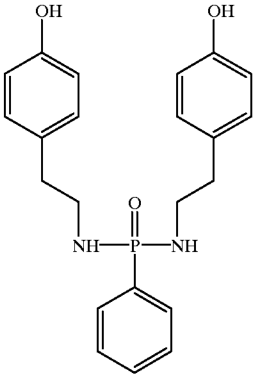
-continued
(S-13)
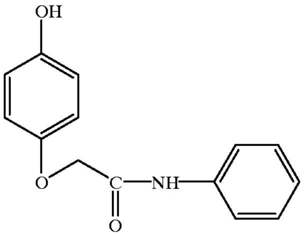
(S-14)
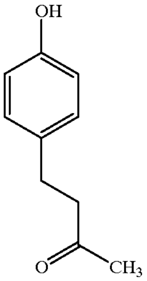
(S-15)
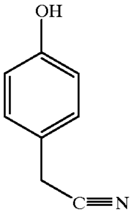
(S-16)
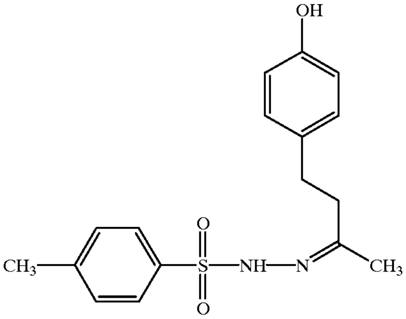
(S-17)
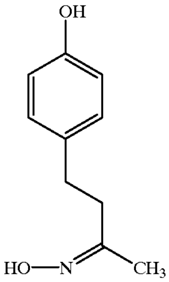

-continued
(S-18)
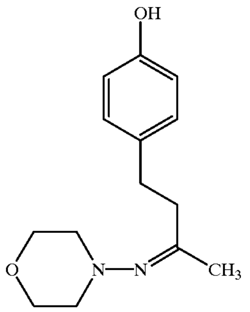
(S-19)
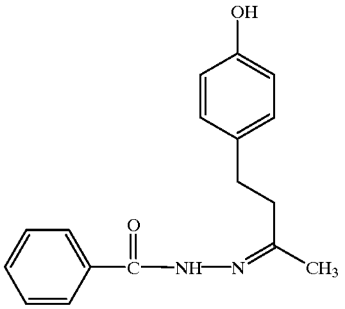
(S-20)
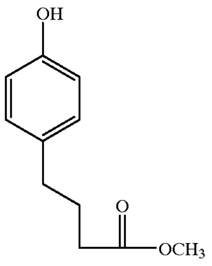
(S-21)
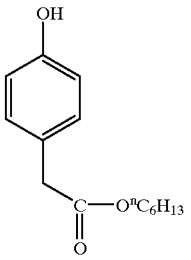
(S-22)
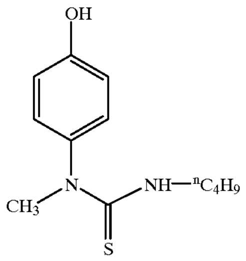
-continued
(S-23)
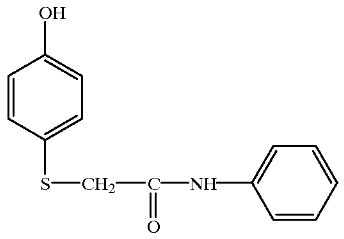
(S-24)
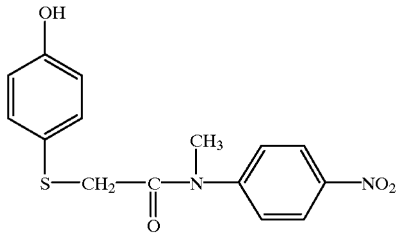
(S-25)
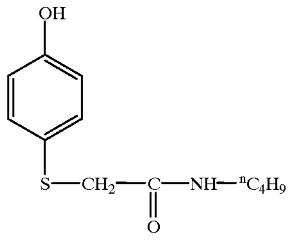
(S-26)
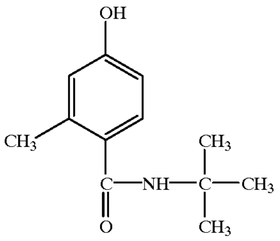
(S-27)
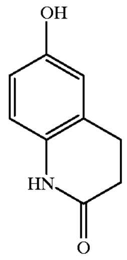
(S-28)
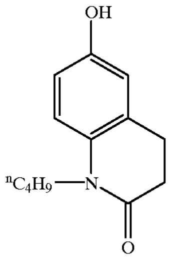

-continued
(S-29)
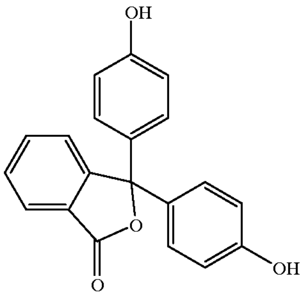
(S-30)
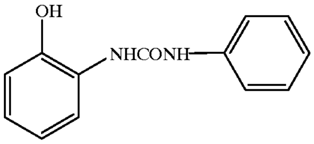
(S-31)
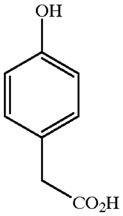
(S-32)
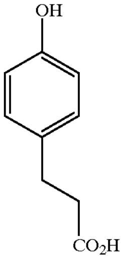
(S-33)
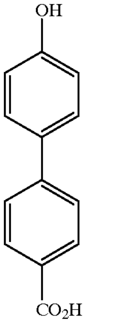
(S-34)
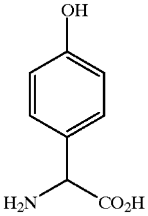
-continued
(S-35)
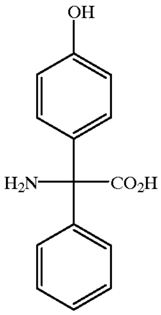
(S-36)
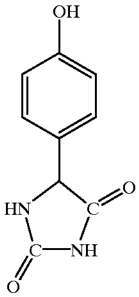
(S-37)
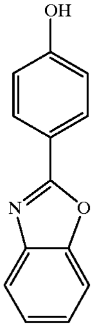
(S-38)
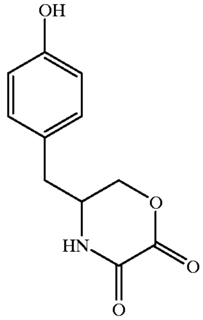
(S-39)
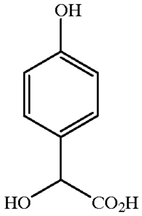

-continued
(S-40)
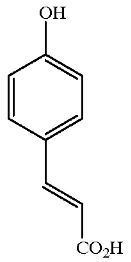
(S-41)
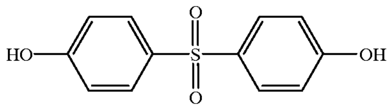
(S-42)
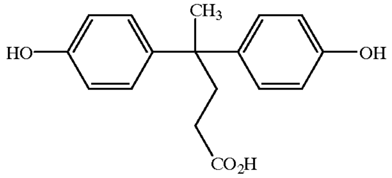
(S-43)
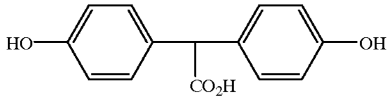
(S-44)
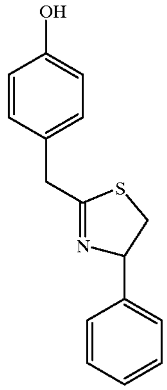
(S-45)
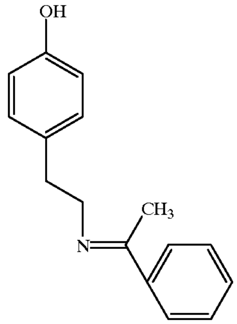
-continued
(S-46)
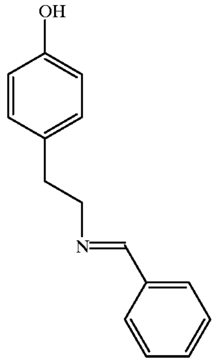
(S-47)
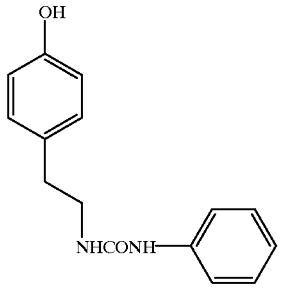
(S-48)
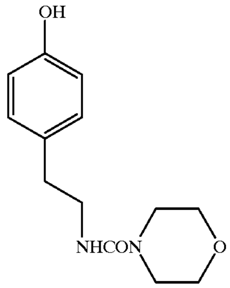
(S-49)
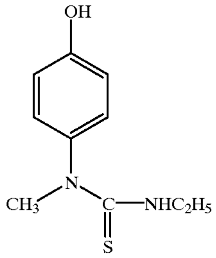
(S-50)
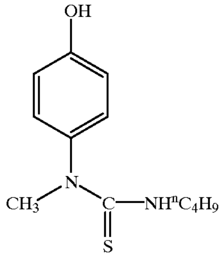

-continued
(S-51)
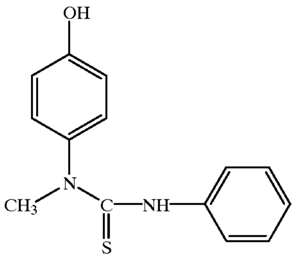
(S-52)
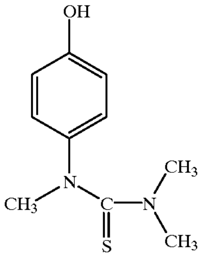
(S-53)
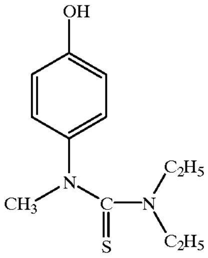
(S-54)
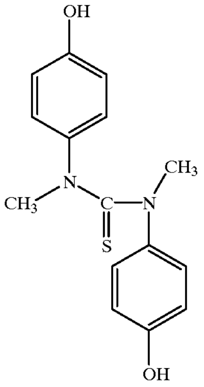
(S-55)
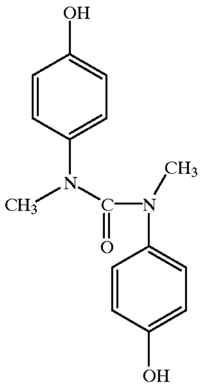
-continued
(S-56)
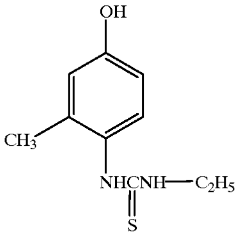
(S-57)
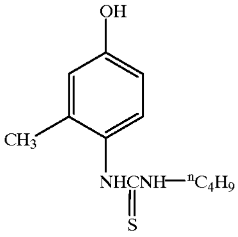
(S-58)
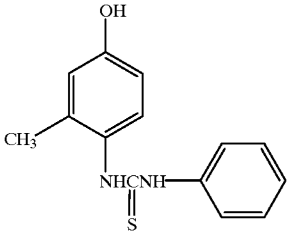
(S-59)
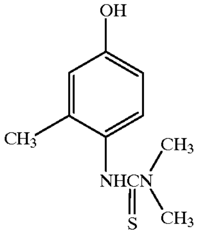
(S-60)
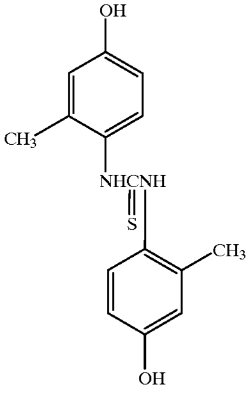

-continued
(S-61)
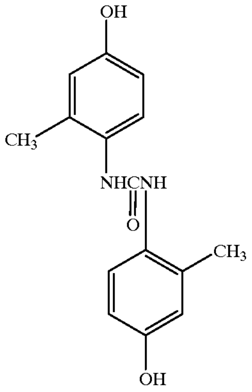
(S-62)
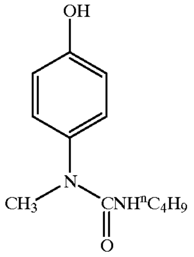
(S-63)
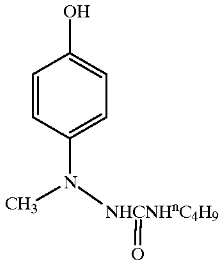
(S-64)
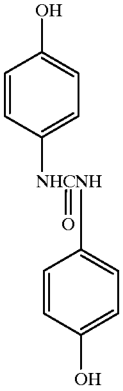
-continued
(S-65)
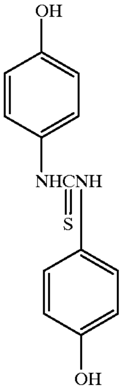
(S-66)
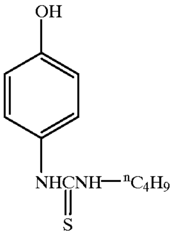
(S-67)
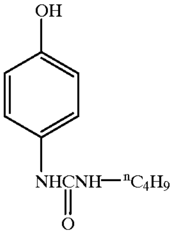
(S-68)
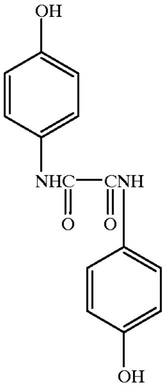

-continued
(S-69)
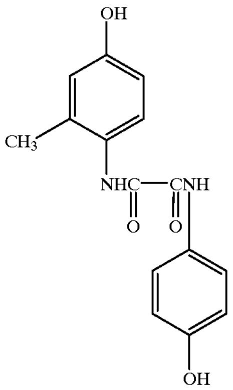
(S-70)
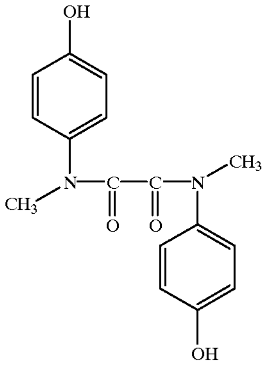
(S-71)
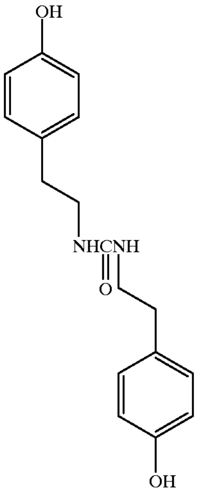
-continued
(S-72)
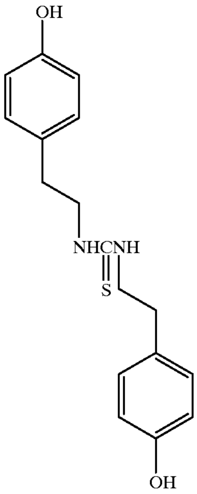
(S-73)
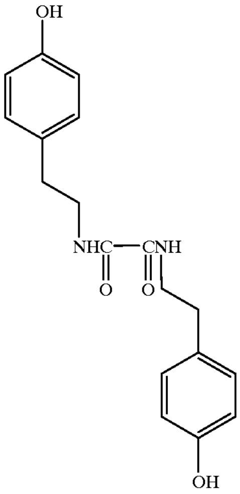
(S-74)
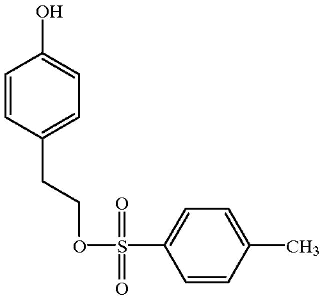

-continued (S-75)

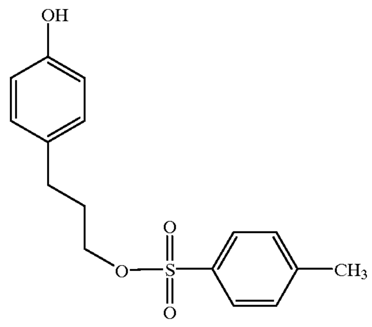

(S-76)

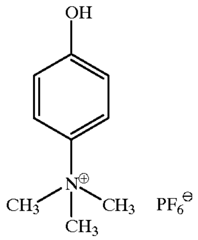

(S-77)

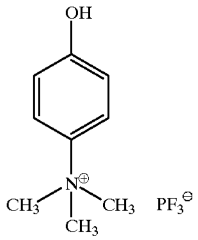

(S-78)

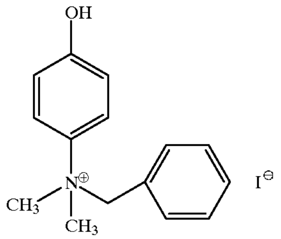

Among the phenolic polymers which are synthesized from the phenol compounds listed above and have the structural units represented by the general formula I-(1), particularly preferable from the standpoint of the ability to promote development is a polymer in which X of the structural unit is a divalent linking group which may have a substituent group and has 2 carbon atoms, namely an ethylene group which may have a substituent group. In addition, it is particularly preferable that Y has an amide or urea structure because such a structure can strongly interact with the phenolic hydroxyl portion of the polymer.

The aromatic hydrocarbon ring $A^1$ in the general formula I-(1) may have 1 to 3 hydroxyl groups at any of o-, m-, and p-positions with respect to the specific functional group —X—Y—Z, but it is particularly preferable that the phenolic polymer have one hydroxyl group at a p-position from the standpoint of suitability for synthesis.

Further, it is preferable that the phenolic polymer of the present invention is a phenolic polymer which has a dissociative active hydrogen atom in the —X—Y—Z group. The term "dissociative hydrogen atom" as used herein means a hydrogen atom which is dissociative in terms of a pKa range of from 4 to 15. Furthermore, it is preferable that the hydrogen atom is dissociative in terms of a pKa range of from 5 to 13 from the standpoint of developability.

It is particularly preferable that the above-described dissociative hydrogen atom is present in the Y portion of —X—Y—Z. In this case, Y is preferably a group having at least one partial structure selected from the following $Y^2$ group. More specifically, Y may be a partial structure itself selected from the $Y^2$ groups, a group comprising a plurality of these partial structures linked together. Moreover, Y may be a group comprising the partial structure $Y^2$ combined with the partial structure $Y^1$ which is an ordinary partial structure of Y, or a group comprising the partial structures $Y^2$ and other hydrocarbon group linked together.

$Y^2$:

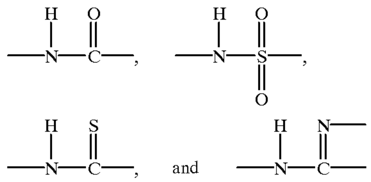

and

The phenolic polymer of the present invention can be synthesized by a known method. The phenolic polymer may be a homopolymer of the phenol compounds listed previously or a copolymer produced from a combination of two or more of the phenol compounds listed previously.

Next, methods for synthesizing a phenolic polymer which has on a polymer backbone a structural unit represented by the general formula I-(1) are described in more detail. Examples of the ordinary method may include the following synthesis schemes (a) and (b).

Synthesis Scheme (a)

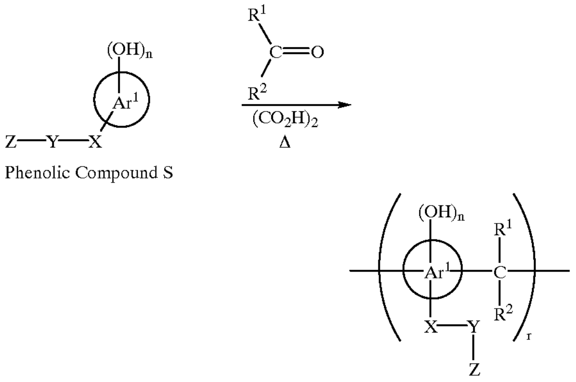

Phenolic Compound S

Phenolic polymer represented by the general formula I-(1)

According to the synthesis scheme (a), a phenolic polymer, which has on a polymer backbone a structural unit represented by the general formula I-(1), can be synthesized by carrying out a dehydrating polycondensation between a phenol compound S and an active carbonyl compound in the presence of an acid catalyst.

Synthesis Scheme (b)

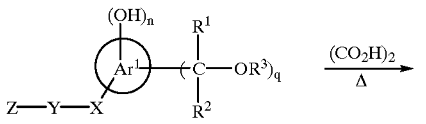

Phenolic Compound T

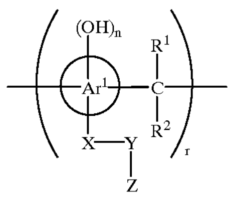

Phenolic polymer represented by the general formula I-(1)

In the formulas, $R^3$ represents a hydrogen atom or an alkyl group having 12 or less carbon atoms, preferably a hydrogen atom or a methyl group: and q is an integer of 1 to 4.

According to the synthesis scheme (b), the phenolic polymer, which has on a polymer backbone a structural unit represented by the general formula I-(1), can be synthesized by carrying out a ($R^3OH$)-eliminating polycondensation of a phenolic compound T in the presence of an acid catalyst.

In the synthesis schemes (a) and (b), it is also possible to form a copolymer by copolymerizing the phenolic compound S or T with other phenolic compound U shown below. In this case, the proportion of the structural unit derived from the phenolic compound U is preferably 0 to 98% by weight and more preferably 0 to 90% by weight in the copolymer obtained. When the proportion is more than 98% by weight, the effects of the present invention cannot be obtained.

Phenolic Compound U

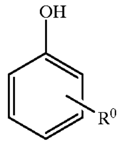

wherein $R^0$ represents a hydrogen atom, an alkyl group having 12 or less carbon atoms, a halogen atom, or an oxygen group substituted with a hydrogen atom or an alkyl group having 12 or less carbon atoms.

In particular, $R^0$ is preferably a hydrogen atom, a methyl group, an ethyl group, a propyl group, a t-butyl group, a t-octyl group, a benzyl group, a phenyl group, a methoxy group, an ethoxy group, a chloro group, a bromo group, a fluoro group, or a hydroxyl group.

In the present invention, the weight average molecular weight of the phenolic polymer is preferably 1,000 or more and more preferably in a range of from 2,000 to 200,000. In this case, r in the general formula I-(1) is an integer of any value which enables the polymer to take a molecular weight in the above-described range. The number average molecular weight is preferably 1,000 or more and more preferably in a range of from 2,000 to 150,000. The index of polydispersity is preferably 1 or more and more preferably in a range of from 1.1 to 10.

The phenolic polymers for use in the present invention may be used alone or in a combination of two or more of them.

The proportion of the phenolic polymer in the image recording material is from 5 to 98% by weight, more preferably from 20 to 90% by weight, based on the weight of the total solid component of the image recording material. When the proportion is less than 5% by weight, the ability to form a film is poor. On the other hand, when the proportion is more than 98% by weight, an image cannot be formed.

In the phenolic polymer constituting the image recording material of the present invention, the density of the photosensitive film of the image recording material can be increased, since the specific functional group —X—Y—Z in the polymer strongly interacts with the phenolic hydroxyl group to form a tied bond. As a result, the film thus formed has such a high density that improves the intra-film transmissivity of heat obtained by the light-to-heat conversion at the time of laser exposure. Further, since the ability to promote development is enhanced, the high sensitivity of the image recording material can be achieved. Furthermore, the high density of the film makes the image recording material less susceptible to external influences such as humidity and temperature. Consequently, the storage stability of the image recording material can also be enhanced.

Examples of the solvent which can be used for the synthesis of the phenolic polymer used in the present invention may include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water.

These solvents may be used alone or in a combination of two or more thereof.

Next, a photosensitive resin composition as another aspect of the present invention and a planographic printing plate using it will be explained in details.

[(a') a Polymer which has at Least a Structural Unit Represented by the General Formula II-(1) or II-(2) and Further a Phenolic Hydroxyl Group]

In a photosensitive resin composition as another aspect of the present invention, it is preferable to use as a binder a polymer which has at least a structural unit represented by the general formula II-(1) or II-(2) and further a phenolic hydroxyl group (which may be referred to as "binder polymer" hereinafter).

In particular, the present invention uses either a polymer having as a polymer backbone at least a structural unit represented by the general formula II-(1) in which the hydrogen atom of a phenolic hydroxyl group is substituted with a specific functional group —X—Y'—Z' via an aromatic hydrocarbon ring Ar in the structural unit or a polymer having as a side chain of the polymer at least a structural unit represented by the general formula II-(2) in which the hydrogen atom of a phenolic hydroxyl group is substituted with a specific functional group —X—Y'—Z' via an aromatic hydrocarbon ring Ar in the same manner as described above and further having a phenolic hydroxyl group (this polymer may be referred to as "binder polymer II-I" hereinafter).

Alternatively, the present invention uses a polymer blend composed of a polymer having as a polymer backbone at least a structural unit represented by the general formula II-(1), in which the hydrogen atom of a phenolic hydroxyl group is substituted with a specific functional group —X—Y'—Z' via an aromatic hydrocarbon ring Ar in the structural unit, or a polymer having as a side chain of the polymer at least a structural unit represented by the general formula II-(2), in which the hydrogen atom of a phenolic hydroxyl group is substituted with a specific functional group —X—Y'—Z' via an aromatic hydrocarbon ring Ar in the same manner as described above, and of a polymer having a phenolic hydroxyl group (this polymer blend may be hereinafter referred to as "binder polymer II-II").

Therefore, a commercially available polymer carrying a phenolic hydroxyl group or a commercially available polymer carrying no phenolic hydroxyl group can become a polymer used in the present invention when the polymer structure is altered such that it has at least the structural unit represented by the general formula II-(1) or II-(2). In the present invention, the former type of polymer may be used alone or alternatively the latter type of polymer may be used in a blend with a commercially available polymer having a phenolic hydroxyl group.

In the general formulas II-(1) and II-(2), Ar represents an aromatic hydrocarbon ring which may have a substituent group. Because of availability as a raw material, preferable as the aromatic hydrocarbon ring are a benzene ring, a naphthalene ring, and an anthracene ring. Examples of preferable substituent groups may include a halogen atom, an alkyl group having 12 or less carbon atoms, an alkoxy group, an alkylthio group, a cyano group, a nitro group, and a trifluoromethyl group. In view of the high sensitivity thereof, a benzene ring or a naphthalene ring is preferable, and a benzene ring is particularly preferable. Ar may have or may not have a substituent. When Ar has a substituent, particularly preferable as the substituent group are a halogen atom, an alkyl group having 6 or less carbon atoms, an alkoxy group, an alkylthio group, and a nitro group.

In the general formulas II-(1) and II-(2), X represents a divalent linking group; Y' represents a divalent linking group having at least one partial structure selected from the aforesaid $Y'^1$ groups, and Z represents a monovalent terminal group.

X in the general formulas II-(1) and II-(2) is defined as in the general formula I-(1) described previously.

Details of Y' in the general formulas II-(1) and II-(2) are given below.

Y' represents a divalent linking group linked to Z' and has the following partial structure. The partial structures listed in the following $Y'^1$ group are each a divalent linking group provided with a dissociative active hydrogen atom. The term "a dissociative hydrogen atom" as used herein means a hydrogen atom which is dissociative in a pKa range of from 4 to 15 and is known to cause a strong interaction with a phenolic hydroxyl group. Besides, the depiction given below does not specify the linking direction of linking groups.

$Y'^1$:

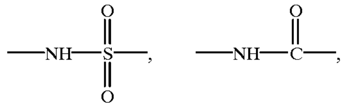

and

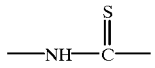

"Y' has the following partial structure" means that Y', which is a linking group, has at least one partial structure selected from the $Y'^1$ groups listed above. Therefore, Y' may have a plurality of these partial structures. Accordingly, Y' may be the partial structure itself, a group comprising a plurality of these partial structures linked together, or a group comprising any of these partial structures and other hydrocarbon groups linked together.

Particularly in the general formulas II-(1) and II-(2), specific examples of preferable compounds having such a partial structure may include amides, sulfonamides, imides, ureas, urethanes, thioureas, carboxylic acids, carboxylate acid esters, and sulfonate esters.

Among $Y'^1$ groups, particularly preferred examples of the linking group are listed below. However, it should be noted that the present invention is not limited by these examples and that the depiction given below does not specify the linking direction of linking groups.

$Y'^2$:

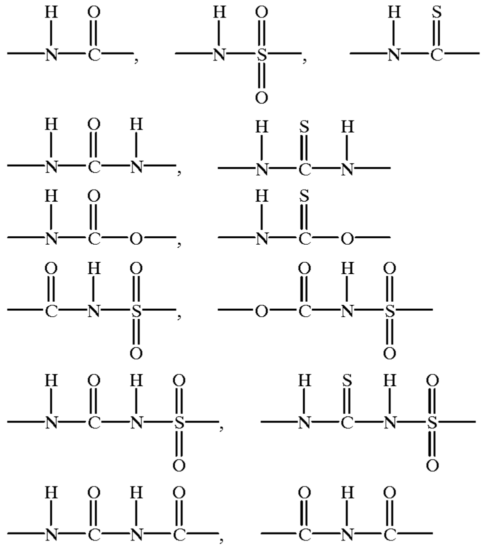

Details of Z' in the general formulas II-(1) and II-(2) are given below.

Z' represents a monovalent terminal group. Preferably, Z' is a hydrocarbon group which may have a substituent group. Examples of preferable hydrocarbon groups may include a linear, branched, or cyclic alkyl group having 1 to 18 carbon atoms; an aryl groups having 6 to 20 carbon atoms; a linear, branched, or cyclic alkenyl group having 2 to 18 carbon atoms; and a linear, branched, or cyclic alkynyl group having 2 to 18 carbon atoms.

Specific examples of preferable Z' may include a methyl group, an ethyl group, a propyl group, an isopropyl group, a butyl group, an isobutyl group, a tertiary butyl group, a secondary butyl group, a pentyl group, a hexyl group, a cyclopentyl group, a cyclohexyl group, an octyl group, a benzyl group, a mesityl group, a tolyl group, a phenyl group, a naphthyl group, an anthracenyl group, an allyl group, and a vinyl group.

Where Z' is has a substituent group, examples of preferable substituent groups may include an alkoxy group having 12 or less carbon atoms, a halogen atom, and a hydroxyl group.

Details of $X^2$ in the general formula II-(2) are given below.

$X^2$ represents either a single bond or a divalent linking group which contains at least one atom selected from C, H, N, O and S, and which has 20 or less carbon atoms. Among them, particularly preferable are a single bond, an amido linkage, a urea linkage, a urethane linkage, an ester linkage, an ether linkage, and a divalent alkylene linking group containing any of the foregoing linkages. Preferable as the alkylene linking group are a methylene group, an ethylene group, a propylene group, and the like.

It is particularly preferable that the binder polymer used in the photosensitive resin composition of the present invention is a polymer which has at least a structural unit represented by the following general formula II-(3) or II-(4) among the polymers having at least a structural unit represented by the following general formula II-(1) or II-(2).

II-(3)

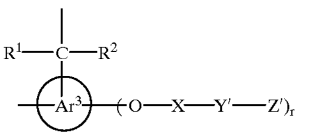

In the general formula II-(3), $Ar^3$ represents a benzene ring, a naphthalene ring, or an anthracene ring, which may have a substituent group. $R^1$ and $R^2$ may be the same or different and each represent a hydrogen atom or a hydrocarbon group having 12 or less carbon atoms and r is an integer of 1 to 4.

II-(4)

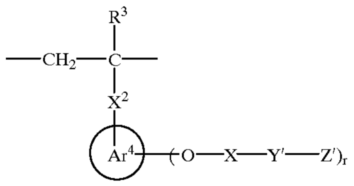

In the general formula II-(4), $Ar^4$ represents a benzene ring, a naphthalene ring, or an anthracene ring, which may have a substituent group. $R^3$ represents a hydrogen atom or a methyl group. $X^2$ represents either a single bond or a divalent linking group which contains at least one atom selected from C, H, N, O and S, and which has 20 or less carbon atoms and r is an integer of 1 to 4.

$Ar^3$ of the general formula II-(3) and $Ar^4$ of the general formula II-(4) may have the other substituent groups listed for Ar in the general formulas II-(1) and II-(2).

Specific examples of the structural units represented by the general formula II-(3) or II-(4) may include, but are not limited to, the following structures.

[K-1]

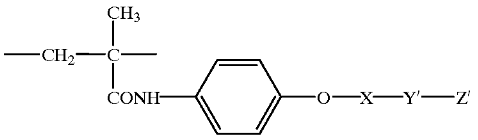

[K-2]

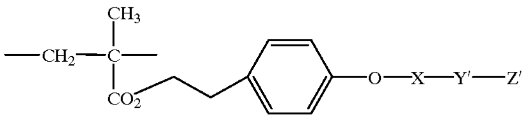

[K-3]

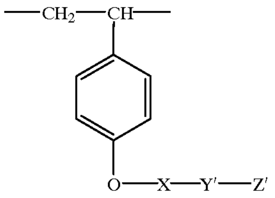

[K-4]

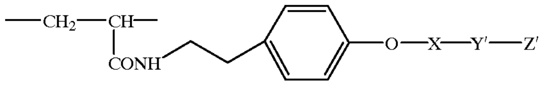

[K-5]

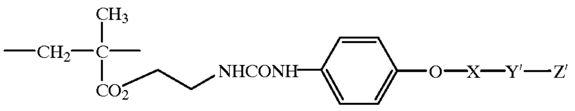

[K-6]

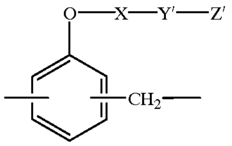

[K-7]

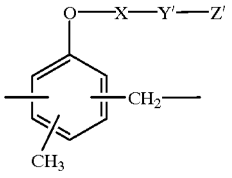

[K-8]

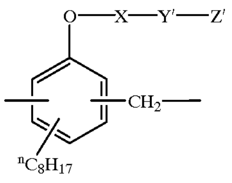

TABLE 9
| No | -X-Y'-Z' |
|---|---|
| [M-1] | 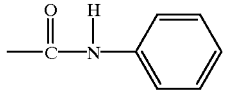 |
| [M-2] | 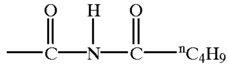 |
| [M-3] | 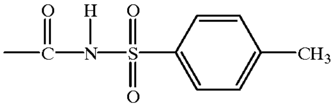 |
| [M-4] | 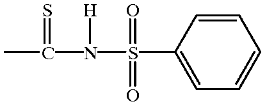 |
| [M-5] | 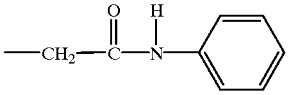 |
| [M-6] | 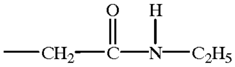 |
| [M-7] | 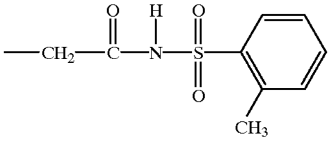 |
| [M-8] | 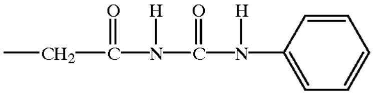 |
| [M-9] | 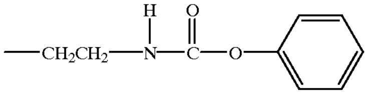 |
| [M-10] | 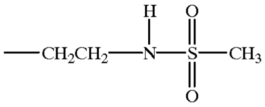 |
| [M-11] | 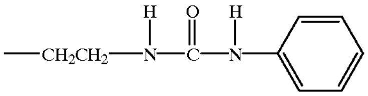 |
| [M-12] | 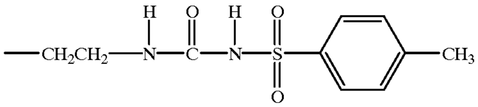 |
| [M-13] | 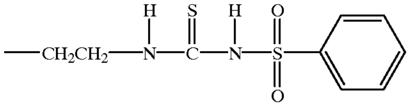 |
| [M-14] | 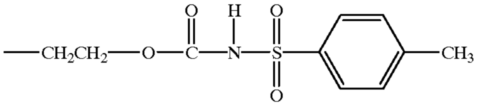 |
| [M-15] | 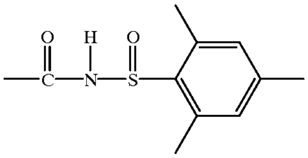 |
| [M-16] | 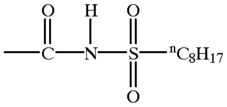 |
| [M-17] | 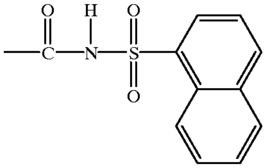 |
| [M-18] | 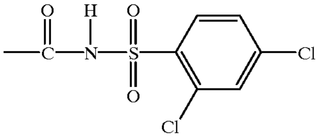 |
| [M-19] | 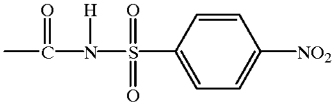 |
| [M-20] | 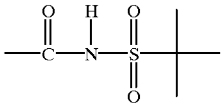 |
| [M-21] | 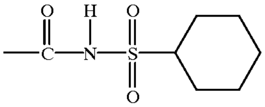 |
| [M-22] | 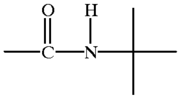 |
| [M-23] | 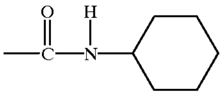 |

TABLE 9-continued

| No | -X-Y'-Z' |
| --- | --- |
| [M-24] | 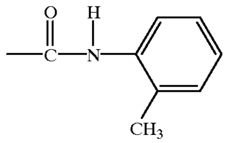 |
| [M-25] | 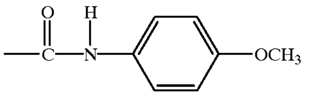 |

The —X—Y'—Z' portions in K-1 to K-8, which are each a structural unit represented by the general formula II-(3) or II-(4), represent, respectively, the functional groups listed in Table 9. For example, when a binder polymer uses K-1 as the structural unit and M-1 as the functional group —X—Y'—Z', the binder polymer comprises the following structure.

(K-1/M-1)

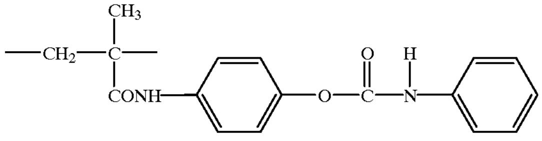

Among the structural units represented by the general formula II-(3) or II-(4) for the binder polymers in the present invention, a structural unit in which X is a single bond is particularly preferable from the standpoint of suitability to production process in synthesis.

Moreover, Y' has a dissociative active hydrogen atom. The dissociative hydrogen atom is dissociative in a pKa range of from 4 to 15. Y' is preferably a partial structure selected from the following $Y'^2$ groups. Among these partial structures, particularly preferable is an amide structure or a urea structure, since such a structure exhibits a strong bonding property to hydrogen and increases penetration of a developing solution into films.

$Y'^2$:

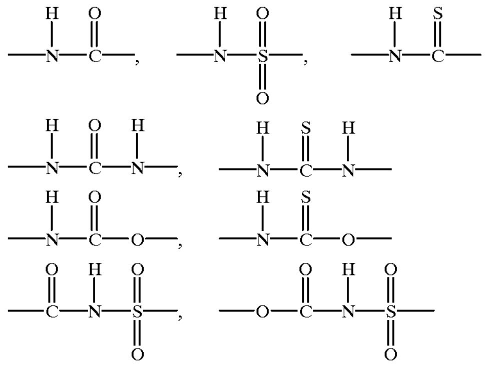

-continued

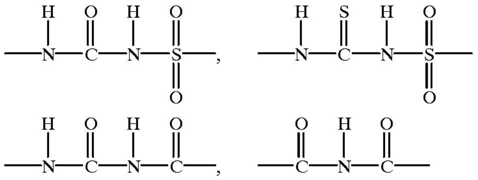

The binder polymer according to the present invention can be synthesized and blended by a known method.

The binder polymer may be a homopolymer having at least a structural unit represented by the general formula II-(1) or II-(2) and further a phenolic hydroxyl group, as indicated by the binder polymer II-I. Alternatively, the binder polymer may be a blend composed of a homopolymer having at least a structural unit represented by the general formula II-(1) or II-(2) and of a polymer made up of structural units having a phenolic hydroxyl group, as indicated by the binder polymer II-II.

Next, the synthesis methods of the binder polymers used in the present invention will be explained in detail. Examples of ordinary methods may include the following (a) and (b).

(a) A method in which —X—Y'—Z' is introduced into a phenolic hydroxyl group of a polymer having the phenolic hydroxyl group on a main and/or side chain by a polymer reaction;

(b) A method in which structural units, which have structural units represented by the general formula II-(1) and/or II-(2) having —X—Y'—Z', are polymerized in advance.

Among the methods (a) and (b), the method (a) is simpler in synthesis. When the above-mentioned polymer has no phenolic hydroxyl group, the polymer is blended with another polymer having a phenolic hydroxyl group.

In the present invention, the weight average molecular weight of the binder polymer is preferably 1,000 or more and more preferably in a range of from 2,000 to 200,000. When the weight average molecular weight is less than 2,000, cracks tend to occur at the time of film formation. On the other hand, when the weight average molecular weight is more than 200,000, developability with alkali is disadvantageously retarded.

Meanwhile, the number average molecular weight is preferably 1,000 or more and more preferably in the range of from 2,000 to 150,000. As in the case of the weight average molecular weight, when the number average molecular weight is less than 2,000, cracks tend to occur at the time of film formation. On the other hand, when the number average molecular weight is more than 150,000, developability with alkali is disadvantageously retarded.

In addition, the index of polydispersity is preferably 1 or more and more preferably in a range of from 1.1 to 10. When the index of polydispersity is less than 1.1, the synthesis is difficult. On the other hand, when the index of polydispersity is more than 10, developability is disadvantageously unstable.

The binder polymers according to the present invention may be used alone or in a combination of two or more of them.

The proportion of the binder polymer in the photosensitive resin composition is in a range of from 5 to 98% by weight, more preferably in a range of from 20 to 90% by weight, based on the weight of the total solid component of the photosensitive composition. When the proportion is less than 5% by weight, the ability to form a film is poor. On the other hand, when the proportion is more than 98% by weight, an image cannot be formed.

In the binder polymer having at least the structural unit represented by the general formula II-(1) or II-(2) used in the photosensitive resin composition of the present invention, the specific functional group —X—Y'—Z' in the polymer has an active hydrogen atom dissociative in a pKa range of from 4 to 15. Therefore, the specific functional group —X—Y'—Z' exhibits a strong interaction to create a hydrogen bond with an adjacent phenolic hydroxyl group in the polymer and can increase the permeation of a developing solution into films at the same time. That is, in the photosensitive resin composition, both negative-type and positive-type, of the present invention, the film thus formed has a high density due to tied bond and the transmissivity of the heat obtained by the light-to-heat conversion at the time of laser exposure is improved. Further, the ability to promote development is enhanced, and both of the sensitivity and the storage stability can be enhanced.

Consequently, the present invention fulfills at the same time the requirements of the film density and the developability which are generally incompatible with each other. Accordingly, it is possible to form a tough film in which a developing treatment can be fully controlled and the difference between image areas and non-image areas is distinct.

(Additional Polymer)

In producing the image recording material or photosensitive resin composition of the present invention (hereinafter referred to simply as "image recording material" unless otherwise specified), it is possible to use a known polymeric compound (hereinafter referred to as "additional polymer"), which is suited for a negative type or a positive type, in combination with either a phenolic polymer having on a polymer backbone a structural unit represented by the following general formula I-(1) or with a binder polymer described as another aspect of the present invention. In this case, depending on a negative type or a positive type, the following additional polymers can be used.

Where the image recording material of the present invention is of a negative type, the polymer usable as the additional polymer is preferably a polymer which has on a side chain or backbone an aromatic hydrocarbon ring having a hydroxyl group or an alkoxy group directly linked thereto.

The alkoxy group is preferably an alkoxy group having 20 or less carbon atoms from the standpoint of sensitivity. Meanwhile, because of availability as a raw material, preferable as the aromatic hydrocarbon ring are a benzene ring, a naphthalene ring, and an anthracene ring. These aromatic hydrocarbon rings may have substituent groups such as a halogen atom, a cyano group, and the like other than a hydroxyl group and an alkoxy group. However, it is preferable that these aromatic hydrocarbon rings do not have any substituent group than a hydroxyl group other and an alkoxy group in view of sensitivity.

More specifically, usable as the additional polymer is a phenolic resin such as a novolak resin or a polymer having a structural unit represented by the following general formula I-(2).

I-(2)

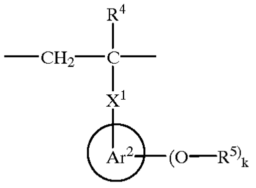

In the general formula I-(2), $Ar^2$ represents a benzene ring, a naphthalene ring, or an anthracene ring. $R^4$ represents a hydrogen atom or a methyl group. $R^5$ represents a hydrogen atom or an alkoxy group having 20 or less carbon atoms. $X^1$ represents either a single bond or a divalent linking group which contains at least one atom selected from C, H, N, O, and S and which has 20 or less carbon atoms and k is an integer of 1 to 4.

Examples of the structural units represented by the general formula I-(2) and suitably used in the present invention may include, but are not limited to, the following structures ([BP-1] to [BP-6]).

[BP-1]

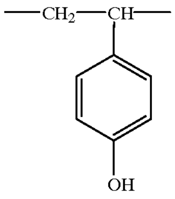

[BP-2]

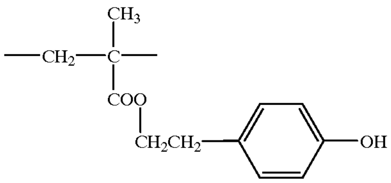

[BP-3]

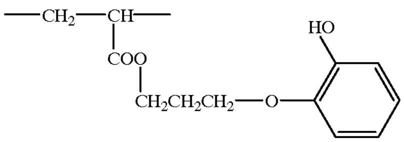

[BP-4]

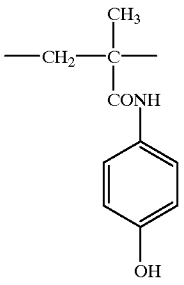

-continued

[BP-5]

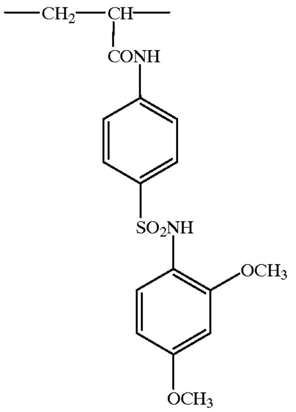

[BP-6]

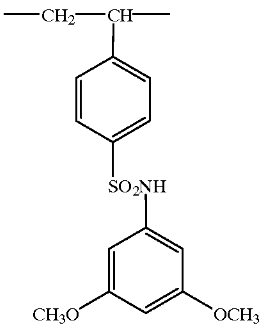

Additional polymers having these structural units can be obtained by a radical polymerization according to a conventionally known method.

In the present invention, the additional polymer may be a homopolymer having the structural unit represented by the general formula I-(2) exclusively, or may be a homopolymer composed solely of a known monomer other than a monomer having the structural unit represented by the general formula 1-(2). Alternatively, the additional polymer may be a copolymer comprising the specific structural unit and a structural unit derived from other known monomer.

Examples of the other known monomers may include acrylate esters, such as methyl acrylate, ethyl acrylate, propyl acrylate, butyl acrylate, 2-ethylhexyl acrylate, cyclohexyl acrylate, 2-hydroxyethyl acrylate, and benzyl acrylate; methacrylate esters, such as methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate; styrene; acrylonitrile; monomers having an acidic group, such as acrylic acid and methacrylic acid; and monomers which contain a salt of a strong acid such as a sodium salt of p-styrenesulfonic acid, an alkali metal salt of 2-acrylamide-2-methylpropanesufonic acid, a tetraalkylammonium salt of 2-acrylamide-2-methylpropanesufonic acid, and a potassium salt of 3-sulfopropyl acrylate.

These additional polymers may be a random polymer, a block polymer, or a graft polymer. However, a random polymer is preferable.

Examples of novolak resins suitably used as additional polymers may include phenol novolak resins, o-, m-, and p-cresol novolak resins, copolymers of such compounds, and novolak resins utilizing a phenol substituted with a halogen atom, an alkyl group, or the like.

The weight average molecular weight of the additional polymer is preferably 1,000 or more and more preferably in a range of from 2,000 to 200,000. The number average molecular weight is preferably 1,000 or more and more preferably in a range of from 2,000 to 150,000. The index of polydispersity is preferably 1 or more and more preferably in a range of from 1.1 to 10.

The additional polymers, which can be used if the image recording material of the present invention is of a positive type, are the following alkali-soluble polymers which each have on a backbone and/or side chain structure any one selected from the following acidic groups (1) to (6).

(1) a phenol group (—Ar—OH);

(2) a sulfonamide group (—$SO_2$NH—R)

(3) an acid group based on a substituted sulfonamide (hereinafter referred to as "active imide group") (—$SO_2$NHCOR, —$SO_2$NH$SO_2$R, or —CONH$SO_2$R);

(4) a carboxylic acid group (—$CO_2$H)

(5) a sulfonic acid group (—$SO_3$H); and (6) a phosphoric acid group (—$PO_3H_2$).

In items (1) to (6), Ar represents a divalent aryl linking group which may have a substitute group, and R represents a hydrocarbon group which may have a substituent group.

Examples of the alkali-soluble polymers having the acidic groups (1) to (6), respectively, may include the following compounds.

(1) Examples of the alkali-soluble polymers having a phenol group may include novolak resins, such as a phenol/formaldehyde polycondensation product, a m-cresol/formaldehyde polycondensation product, a p-cresol/formaldehyde polycondensation product, a m-/p-cresol mixture/formaldehyde polycondensation product, a phenol/cresol (any one selected from m-cresol, p-cresol, and a mixture of m-cresol and p-cresol)/formaldehyde polycondensation product, and a pyrogallol/acetone polycondensation product. A further example is a copolymer obtained by a copolymerization of monomers having a phenol group on a side chain thereof.

(2) Examples of the alkali-soluble polymers having a sulfonamide group may include a polymer comprised mainly of monomers having a sulfonamide group.

(3) Examples of the alkali-soluble polymers having an active imide group may include a polymer comprised mainly of monomers having an active imide group.

(4) Examples of the alkali-soluble polymers having a carboxylic acid group may include a polymer comprised mainly of monomers each having in the molecule thereof one or more carboxylic acid groups and one or more polymerizable unsaturated bonds.

(5) Examples of the alkali-soluble polymers having a sulfonic acid group may include a polymer comprised mainly of monomers each having in the molecule thereof one or more sulfonic acid groups and one or more polymerizable unsaturated bonds.

(6) Examples of the alkali-soluble polymers having a phosphoric acid group may include a polymer comprised mainly of monomers each having in the molecule thereof one or more phosphoric acid groups and one or more polymerizable unsaturated bonds.

These additional polymers may be used alone or in a combination of two or more of them. The additional polymer may be used in combination with either a phenolic polymer having a structural unit represented by the general formula I-(1) or a binder polymer described as another aspect of the present invention and having a structural unit represented by the general formula II-(1) and/or II-(2), with the proviso that the amount added of the additional polymer is in a range of from 0 to 95% by weight, preferably from 0 to 90%, and more preferably from 10 to 90% by weight in place of the phenolic polymer or the binder polymer. When the amount added of the additional polymer is more than 95% by weight, the effects of the present invention, namely enhancement of sensitivity and improvement in storage stability, cannot be achieved.

According to the image recording material of the present invention, the use of a phenolic polymer having the structural unit represented by the general formula I-(1), in particular a specific functional group —X—Y—Z, enhances sensitivity to an infrared laser and storage stability. Despite a general trend that the storage stability of an image recording material having a high sensitivity is worsened as the sensitivity increases, the use of the phenolic polymer prevents the deterioration during storage and enables the material to well maintain the storage stability even under a highly humidity condition.

Although no perfectly clear mechanism is established to explain this phenomenon, the present inventors have found that a novolak-based phenolic polymer having a specific functional group —X—Y—Z is excellent in terms of sensitivity and storage stability as a result of comparative experiments. Further, after intense studies about the effects of the specific functional group, they have found that the above-mentioned high sensitivity and storage stability can be made compatible with each other and can be enhanced in the case where the interaction of a functional group with a phenolic hydroxyl group (i.e., hydrogen bond, donor/acceptor interaction, or acid/base interaction) is so large that, for example, the enthalpy (-ΔH) of the interaction between a model compound having the functional group and a phenol satisfies the following formula described in a known publication, i.e., Joesten Schaad, "Hydrogen bonding", pp.291–381.

$$-\Delta H > 3.0 \text{ kcal/mol}$$

Based on this finding, it can be presumed that since the presence of a specific functional group —X—Y—Z, which strongly interacts with a phenolic hydroxyl group of a polymer to create a hydrogen bond, makes the film more resistant to external factors (water and heat) and since the intermolecular interaction increases the film density, a uniformly dispersed "compound cross-linked in the presence of an acid" (hereinafter referred to as "cross-linking agent" on occasion), as described later, and a coloring agent are strongly held in the polymer molecules. Therefore, cross-linking efficiency is enhanced when the image recording material of the present invention is of a negative type and the positive working is enhanced when the image recording material of the present invention material is of a positive type.

It has been known that the excess proportions of the cross-linking agent and the coloring agent lead to the separation of, the cross-linking agent and the coloring agent from the polymer, and the deposition of crystals on the surface of the polymer, thus causing a defect known as "bleeding". The present inventors have established as an experimental fact the use of a phenolic polymer having in the structural unit thereof a specific functional group —X—Y—Z significantly diminishes the above-mentioned defect in comparison with the use of a conventional novolak-based polymer which does not have the specific functional group. This fact is also believed to support the presumption described above.

The presumption is believed to be also supported by the fact the use of a phenolic polymer having on a polymer backbone a structural unit represented by the general formula I-(1) leads to a sufficient sensitivity irrespective of whether a phenolic hydroxyl group is present on a side chain as in polyhydroxystyrene or a phenolic hydroxyl group is present on a backbone as in novolak and by the fact that a sufficient sensitivity is also obtained even if the phenolic polymer itself is polyfunctional and has a fairly large molecular weight.

A photosensitive composition according to another aspect of the present invention can provide enhanced sensitivity to an infrared laser and an increased storage stability by using as a binder a polymer having at least a structural unit represented by the general formula II-(1) as a polymer backbone or a structural unit represented by the general formula II-(2) as a side chain linked to polymer backbone and further a phenolic hydroxyl group or alternatively a polymer blend comprising a polymer having at least a structural unit represented by the general formula II-(1) as a polymer backbone or a structural unit represented by the general formula II-(2) as a side chain linked to polymer backbone and a polymer having a phenolic hydroxyl group. Despite a general trend that the storage stability of an image recording material having a high sensitivity becomes worse as the sensitivity increases, the use of the polymer or polymer blend prevents the deterioration during storage and enables the material to well maintain the storage stability even under a highly humidity condition.

Although no perfectly clear mechanism is established to explain this phenomenon, the present inventors have found that a polymer having a specific functional group —X—Y'—Z' is excellent in terms of sensitivity and storage stability as a result of comparative experiments. Further, after intense studies about the effects of the specific functional group, they have found that the above-mentioned high sensitivity and storage stability can be made compatible with each other and can be enhanced in the case where the interaction of a functional group with a phenolic hydroxyl group (i.e., hydrogen bond, donor/acceptor interaction, or acid/base interaction) is so large that, for example, the enthalpy (-ΔH) of the interaction between a model compound having the functional group and a phenol satisfies the following formula described in a known publication, i.e., Joesten Schaad, "Hydrogen bonding", pp.291–381.

$$-\Delta H > 3.0 \text{ kcal/mol}$$

Based on this finding, it can be presumed that since the presence in the polymer of a specific functional group —X—Y'—Z', which strongly interacts with a phenolic hydroxyl group to create a hydrogen bond, makes the film more resistant to external factors (water and heat) and since the intermolecular interaction increases the film density, a uniformly dispersed "compound cross-linked in the presence of an acid" (hereinafter referred to as "cross-linking agent"), as described later, and a coloring agent are strongly held in the polymer molecules. Therefore, cross-linking efficiency is enhanced when the image recording material of the present invention is of a negative type and the positive working is enhanced when the image recording material of the present invention material is of a positive type.

It has been known that the excess proportions of the cross-linking agent and the coloring agent lead to the separation of the cross-linking agent and the coloring agent from the polymer and the deposition of crystals on the surface of the polymer, thus causing a defect known as "bleeding". The present inventors have established as an experimental fact the use of a binder polymer having in the structural unit thereof a specific functional group significantly diminishes the above-mentioned defect in comparison with the use of a conventional polymer which does not have the specific functional group. This fact is also believed to support the presumption described above.

The presumption is believed to be also supported by the fact the use of a binder polymer having at least a structural unit represented by the general formula II-(1) or II-(2) in the polymer leads to a sufficient sensitivity irrespective of whether a phenolic hydroxyl group is present on a side chain as in polyhyroxystyrene or a phenolic hydroxyl group is present on a backbone as in novolak and by the fact that a sufficient sensitivity is also obtained even if the binder polymer itself is polyfunctional and has a fairly large molecular weight.

[(b) Infrared Ray Absorbing Agents]

The image recording material or photosensitive resin composition of the present invention is a recording material or composition in which image-wise recording can be made using an infrared laser. Therefore, it is preferable that the recording material or composition contains an infrared ray absorbing agent.

An infrared ray absorbing agent has a function to convert the absorbed infrared ray into heat, wherein the generated heat decomposes (d) an acid generating agent, which is described later, so that an acid is generated when the image recording material of the present invention is of a negative type, or wherein a photochemical reaction or the like takes place as a result of laser scanning so that the solubility of the image recording material to a developing solution significantly changes when the image recording material of the present invention is of a positive type.

The infrared absorbing agents used in the present invention are a dye or pigment effectively absorbing an infrared ray having an wavelength of 760 nm to 1200 nm. It is preferable that the dye or pigment has an absorption maximum between the wavelengths of 760 nm and 1200 nm.

The infrared absorbing agents, which can be used when the image recording material or photosensitive resin composition of the present invention is of a negative type, are described below.

As dyes, known dyes commercially available or those described in the literature (such as "Senryo Binran (Dye Handbook)" edited by Yuki Gosei Kagaku Kyokai (Organic Synthetic Chemistry Association), published in 1970, can be used. Specifically, examples may include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium dyes, and metal thiolate complex.

Examples of preferable dyes may include cyanine dyes disclosed in JP-A Nos. 58-125,246, 59-84,356, 59-202,829, and 60-78,787; methine dyes disclosed in JP-A Nos. 58-173,696, 58-181,690, and 58-194,595; naphthoquinone dyes disclosed in JP-A Nos. 58-112,793, 58-224,793, 59-48,187, 59-73,996, 60-52,940, and 60-63,744; squarylium dyes disclosed in JP-A No. 58-112,792; and cyanine dyes disclosed in U.K. Patent No. 434,875.

Furthermore, near infrared absorption sensitizing agents disclosed in U.S. Pat. No. 5,156,938 can be preferably used. Moreover, substituted aryl benzo (thio) pyrylium salts disclosed in U.S. Pat. No. 3,881,924; trimethine thiapyrylium salts disclosed in JP-A No. 57-142,645 (U.S. Pat. No. 4,327,169); pyrylium-containing compounds disclosed in JP-A Nos. 58-181,051, 58-220,143, 59-41,363, 59-84,248, 59-84,249, 59-146,063, and 59-146,061; cyanine dyes disclosed in JP-A No. 59-216,146; pentamethine thiopyrylium salts disclosed in U.S. Pat. No. 4,283,475; and pyrylium compounds disclosed in Japanese Patent Application Publication (JP-B) Nos. 5-13,514 and 5-19,702.

As other examples of preferable dyes, are near infrared absorption dyes disclosed in U.S. Pat. No. 4,756,993 represented by formulas (I) and (II) can be presented.

Among these dyes, particularly preferable are cyanine dyes, squarylium dyes, pyrylium dyes, and nickel thiolate complexes.

Pigments used in the present invention may include commercially available pigments and those disclosed in the Color Index (C. I.) Manual; "Saishin Ganryo Binran (Modern Pigment Manual)" edited by Nihon Ganryo Gijutsu Kyokai (Japan Pigment Technology Association), published in 1977; Saishin Ganryo Oyo Gijutsu (Modern Pigment Application Technology) by CMC Press, published in 1986; and "Insatsu Ink Gijutsu (Printing Ink Technology)" by CMC Press, published in 1984.

Examples of pigments may include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods may include a method of surface coating with a resin or a wax; a method of adhering a surfactant; and a method of bonding a reactive substance (such as a silane coupling agent, an epoxy compound, and a polyisocyanate) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press, published in 1984; and Saishin Ganryo Oyo Gijutsu (Modern Pigment Application Technology) by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording layer.

As methods of dispersing a pigment, known dispersing methods employed in ink production or toner production can be used. Examples of dispersing machine may include ultrasonic dispersing machines, sand mills, attritors, pearl mills, super mills, ball mills, impellers, dispersers, KD mills, colloid mills, dynatrons, triple roll mills, and pressurized kneaders. Details thereof are described in Saishin Ganryo Oyo Gijutsu (Modern Pigment Application Technology) by CMC Press, published in 1986.

These dyes or pigments can be added in the image recording material in an amount of 0.01 to 50% by weight based on the weight of the total solid component of the image recording material, preferably in an amount of 0.1 to 10% by weight, more preferably in an amount of 0.5 to 10% by weight in the case of a dye, and more preferably in an amount of 1.0 to 10% by weight in the case of a pigment. An amount of a pigment or dye less than 0.01% by weight causes low sensitivity. On the other hand, an amount more than 50% by weight produces stains in a non-image portion at the time of printing.

These dyes or pigments may be added to the same layer together with other components, or alternatively a separate layer may be formed to contain these dyes or pigments.

The infrared absorbing agents, which can be used when the image recording material or photosensitive resin composition of the present invention is of a positive type, are described below.

When infrared absorbing agents are used in a positive-type image recording material or photosensitive resin composition, infrared absorbing agents having onium salt structures are particularly preferable, since it is necessary for them to produce a positive-working action (in which the development is promoted because the development of an unexposed portion is inhibited and the development of an exposed portion is allowed to proceed) by an interaction with a phenolic polymer of the general formula I-(1) having a specific functional group or with a binder polymer according to another aspect of the present invention. Specifically, particularly preferable are cyanine dyes and pyrylium salts among the aforesaid infrared absorbing agents usable in the negative-type image recording material or photosensitive resin composition. The details of the cyanine dyes and pyrylium salts are described previously.

Meanwhile, anionic, infrared ray absorbing agents disclosed in Japanese Patent Application No. 10-79,912 can also be suitable used.

The term "anionic, infrared ray absorbing agent" is used herein to refer to an infrared ray absorbing agent which mother nucleus, does not have a cationic structure but has an anionic structure in the mother nucleus of the dye which substantially absorbs infrared rays.

Examples of the anionic, infrared ray absorbing agent may include (c1) an anionic metal complex; (c2) an anionic carbon black; (c3) an anionic phthalocyanine; and (c4) a compound represented by the general formula I-(3). The counter ion of the anionic, infrared ray absorbing agent is a monovalent cation including a proton or a polyvalent cation.

$$\{G_a^-{-}M{-}G_b\}_m \quad X^{m+} \qquad \text{I-(3)}$$

[$G_a^-$ represents an anionic substituent group; $G_b$ represents a neutral substituent group; $X^{m+}$ represents a cation having a valence of 1 to m, including a proton, wherein m represents an integer of 1 to 6.]

The term "(c1) anionic metal complex" is used herein to refer to a substance in which the total of the central metal and the ligand in the complex portion substantially absorbing light is anionic.

Examples of (c2) the anionic carbon black may include a carbon black to which an anionic group such as a sulfonic acid group, a carboxylic acid group or a phosphonic acid group, is linked as a substituent group. A method for introducing such a group into carbon black may advantageously comprise oxidizing the carbon black with a desired acid as described on page 12 of Carbon Black Binran (Carbon Black Manual) 3rd edition (edited by Carbon Black Association, published on April 5 in 1995).

An anionic, infrared ray absorbing agent, in which an onium salt as a counter cation is linked to the anionic group of the anionic carbon black through an ionic bond, is suitably used in the present invention. However, it should be noted that a substance, in which an onium salt is adsorbed to the carbon black, is not included in the anionic, infrared ray absorbing agent of the present invention. The substance produced by mere adsorption cannot achieve the effect of the present invention.

The term "(c3) anionic phthalocyanine" is used herein to refer to a phthalocyanine which is anionic as a whole comprising a phthalocyanine skeleton having linked thereto an anionic group described as a substituent group in the explanation of (c2).

The details of (c4) compounds represented by the general formula I-(3) are described below.

In the general formula I-(3), M represents a conjugated chain, which may have a substituent group or a cyclic structure. The conjugated chain M can be represented by the following formula.

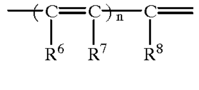

In the formula, each of $R^6$, $R^7$, and $R^8$ represents independently a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group. These groups may join together to form a cyclic structure. n is an integer of 1 to 8.
Among the anionic, infrared ray absorbing agents represented by the general formula I-(3), suitably used in the present invention are A-1 to A-19 given below.
A-1
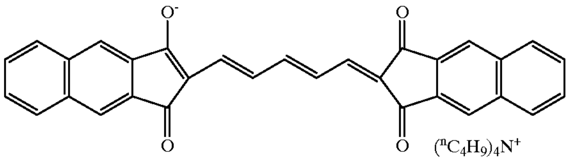
A-2
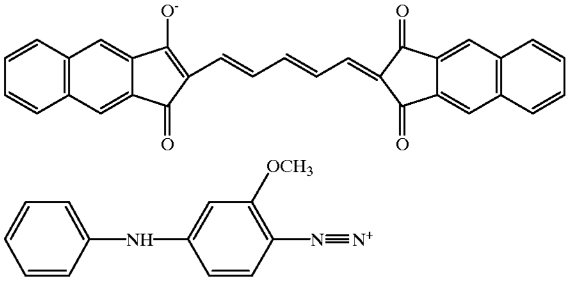
A-3
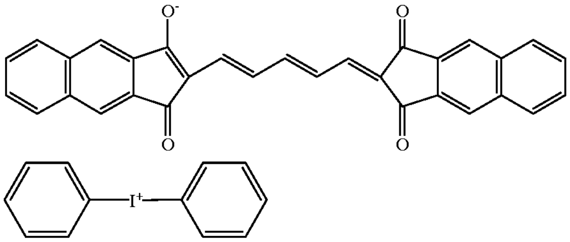
A-4
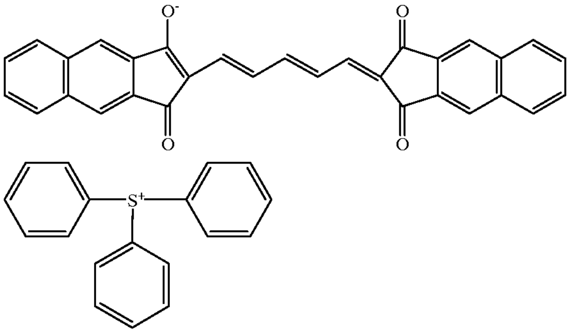
A-5
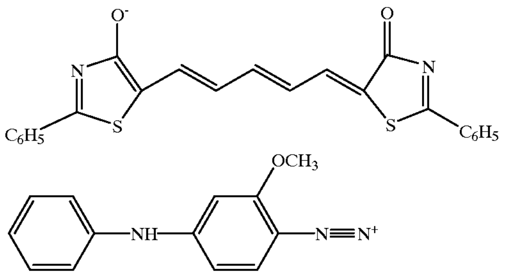
-continued
A-6
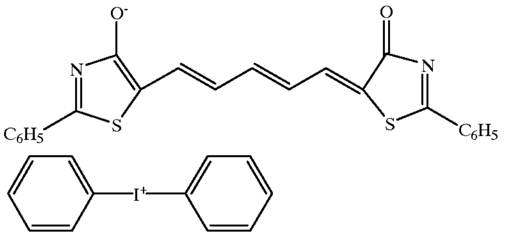
A-7
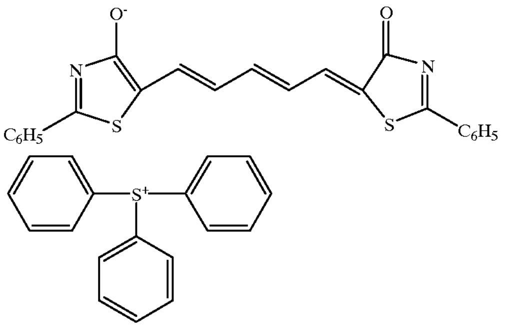
A-8
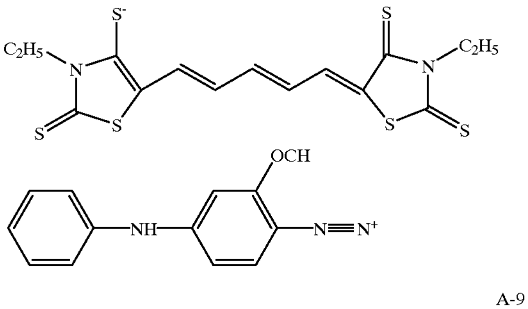
A-9
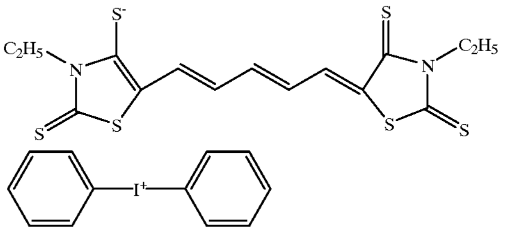
A-10
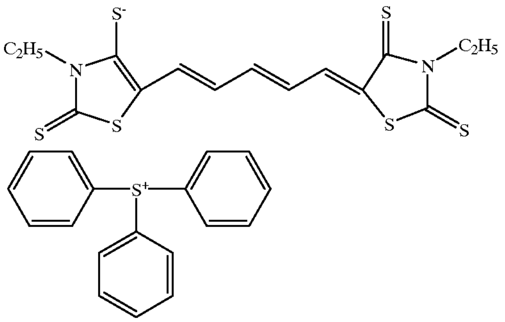

-continued

A-11

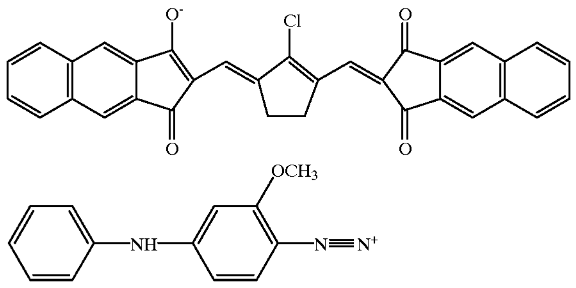

A-12

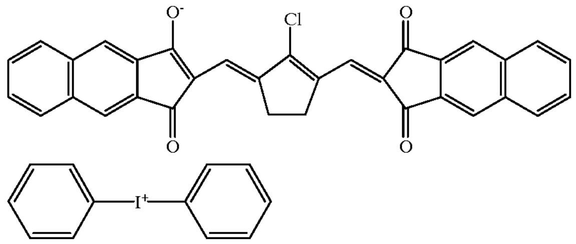

A-13

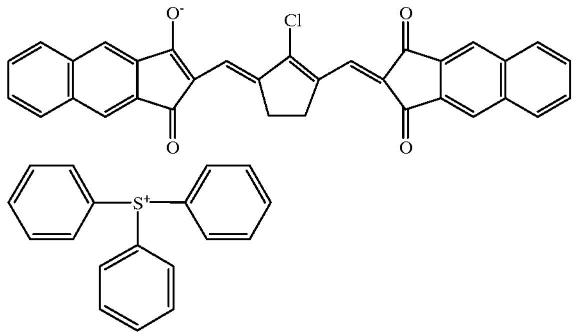

A-14 carbon-black-$CO_2^-$

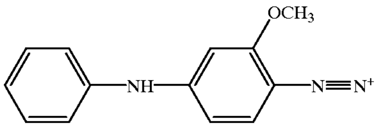

A-15 carbon-black-$CO_2^-$

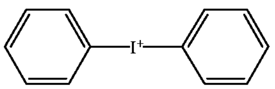

A-16 carbon-black-$CO_2^-$

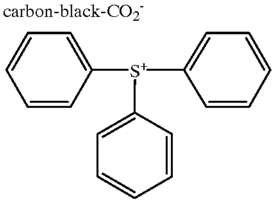

-continued

A-17

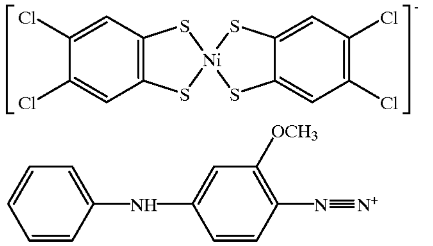

A-18

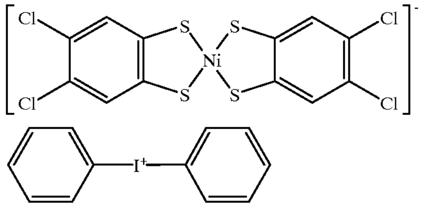

A-19

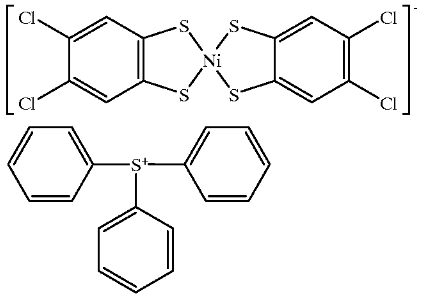

When the image recording material or photosensitive composition of the present invention is of a positive type, the above-mentioned infrared ray absorbing agents in the same amounts as used for the image recording material or photosensitive composition of a negative type can also be used.

In order to enhance sensitivity and development latitude, dyes, pigments, and the like (infrared ray absorbing agents described as used for a negative image recording material) other than the above-mentioned cyanine dyes, pyrylium dyes, and anionic coloring agents can also be incorporated into the positive the image recording material or photosensitive composition of the present invention.

[(c) Compounds Cross-linkable in the Presence of an Acid]

When the image recording material or the photosensitive composition of the present invention is of a negative type, suitably used as compounds cross-linkable in the presence of an acid are methylol compounds, alkoxymethyl compounds, and resol resins described in Japanese Patent Application No. 9-234,406.

In the present invention, these compounds, which are cross-linkable in the presence of an acid, is used in an amount of 5 to 70% by weight, preferably in an amount of 1 to 50% by weight, based on the weight of the total solid component of the image recording material or photosensitive resin composition. An amount less than 5% by weight causes poor film strength of an image portion at the time of image recording. On the other hand, an amount more than 70% by weight adversely affects the storage stability.

[(d) Compounds which Generate an Acid in the Presence of Heat]

A compound which generates an acid in the presence of heat (acid-generating agent) can also be incorporated into the image recording material or photosensitive composition of the present invention. The acid-generating agent indicates a compound which is decomposed at or above 100° C. to generate an acid. The acid thus generated is preferably a strong acid such as sulfonic acid or hydrochloric acid having a pKa value of 2 or less.

Examples of the acid generating agents suitably used in the present invention include onium salts such as iodonium salts, sulfonium salts, phosphonium salts, and diazonium salts. Specifically, the examples may include the compounds described in U.S. Pat. No. 4,708,925 and JP-A No. 7-20,629. Particularly preferable are iodonium salts, sulfonium salts, and diazonium salts, in which counter ions are sulfonate ions. As the diazonium salts, preferable are the diazonium compounds described in U.S. Pat. No. 3,867,147, diazonium compounds described in U.S. Pat. No. 2,632,703, and diazo resins described in JP-A Nos. 1-102,456 and 1-102,457. Also preferable are benzyl sulfonates described in U.S. Pat. Nos. 5,135,838 and 5,200,544. Further, also preferable are active sulfonate esters and disulfonyl compounds described in JP-A Nos. 2-100,054, 2-100,055 and 9-197,671. Furthermore, also preferable are haloalkyl-substituted S-triazines described in JP-A No. 7-271,029.

These acid-generating agents can be added in the image recording material in an amount of 0.01 to 50% by weight, preferably in an amount of 0.1 to 40% by weight, and more preferably in an amount of 0.5 to 30% by weight, based on the weight of the total solid component of the image recording material. An amount less than 0.01% by weight cannot produce an image. On the other hand, an amount more than 50% by weight produces stains in a non-image portion.

These acid-generating agents may be used alone or in a combination of two or more of them. Since these acid-generating agents can also be decomposed by the irradiation of ultraviolet rays, the image recording material of the present invention can be used for image recording not only by infrared rays but also by ultraviolet rays.

[Other Components]

In the present invention, though the aforesaid components are described to be contained in the image recording material, various compounds may be optionally added other than the aforesaid components. They are described below.

For example, a dye having a large absorption in the visible light region may be used as the coloring agent. Specifically, examples may include Oil Yellow # 101, Oil Yellow # 103, Oil Pink # 312, Oil Green BG, Oil Blue BOS, Oil Blue # 603, Oil Black BY, Oil Black BS, and Oil Black T-505 (manufactured by Orient Chemical Industry, Co., Ltd.), Victoria Pure Blue, Crystal Violet (CI42555), Methyl Violet (CI42535), Ethyl Violet (CI42600), Rhodamine B(CI145170B), Malachite Green (CI42000), Methylene Blue (CI52015) and AIZEN SPILON BLUE C-RH (manufactured by Hodogaya Chemical Co., Ltd.), and dyes described in JP-A No. 62-293,247.

It is preferable to add these dyes for easily distinguishing the image portion and the non-image portion after the image formation. The amount to be added is from 0.01 to 10% by weight based on the total solid component of the image recording material.

In order to enable stable treatment regardless of the fluctuation in development conditions, a nonionic surfactant disclosed in JP-A Nos. 62-251,740 and 3-208,514 and an amphoteric surfactant disclosed in JP-A Nos. 59-121,044 and 4-13,149 can be added to the image recording material of the present invention.

Examples of nonionic surfactants may include sorbitan tristearate, sorbitan monopalmitate, sorbitan trioleate, stearic acid monoglyceride, and polyoxyethylene nonylphenyl ether.

Examples of amphoteric surfactants may include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-substituted betaine (for example, Amogen K manufactured by Dai-ichi Kogyo Seiyaku Co., Ltd.).

The amount of the above-described nonionic surfactants and amphoteric surfactants is preferably from 0.05 to 15% by weight, and more preferably from 0.1 to 5% by weight in an image recording material.

In order to provide flexibility to the film, etc., a plasticizer can be added to the image recording layer of the present invention, if necessary. Examples of the plasticizer may include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The photosensitive layer of the image recording material of the present invention can be produced, in general, by dissolving the above-described components in a solvent and applying the resultant solution to an appropriate substrate.

Solvents used herein may include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butylolactone, toluene, and water. These solvents may be used alone or in combination thereof. The concentration of the above-described components (total solid component including additives) is preferably from 1 to 50% by weight in the solution. The application amount (solid component) on the substrate obtained after applying and drying is determined according to the application purpose. However, as to the planographic printing plate, in general, 0.5 to 5.0 $g/m^2$ is preferable.

As a method of application, various methods can be used, such as bar coater application, rotation application, spray application, curtain application, dip application, air knife application, blade application, and roll application. As the application amount decreases, the film characteristics of the image recording film become poor, although apparent sensitivity increases.

A surfactant for improving the applicability, such as a fluorine-containing surfactant described in JP-A No. 62-170,950, can be added to the image recording material of the present invention. An addition amount is preferably from 0.01 to 1% by weight based on the total solid component of the image recording material, and more preferably from 0.05 to 0.5% by weight.

[Substrates]

A substrate, to which the image recording material of the present invention can be applied, is a dimensionally stable plate. Examples thereof may include paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is preferable as a substrate in the present invention. In particular, an aluminum plate is preferable since it has good dimension stability and can be provided at a relatively low cost. The examples of preferable aluminum plates may include pure aluminum plates and alloy plates comprising aluminum as the main component and trace quantities of a different element. Furthermore, plastic films to which aluminum is laminated or deposited can also be used. Examples of different elements included in an aluminum alloy include silicon, iron, manganese, copper, magnesium, chromium, zinc, bismuth, nickel, and titanium. An amount of the total different elements in the alloy is 10% by weight or less. In the present invention, pure aluminum is particularly preferable. However, since production of a completely pure aluminum is difficult in terms of refining technology, one containing trace quantities of a different element can be used. The composition of the aluminum plate applied in the present invention as mentioned above is not specifically defined, and a known aluminum plate can be also used. The thickness of an aluminum plate used in the present invention is from about 0.1 to 0.6 mm, preferably from 0.15 to 0.4 mm, and more preferably from 0.2 to 0.3 mm.

Prior to graining of the aluminum plate, optionally, a drawing oil on the surface may be removed. For this treatment, a degreasing treatment is conducted by using a surfactant, an organic solvent, an alkaline aqueous solution, or the like.

As the graining method, any of mechanical method, electrochemical method of dissolving the surface, and chemical method of selectively dissolving the surface may be adopted among various methods. As the mechanical method, a ball abrasion method, a brush abrasion method, a blast abrasion method, and a buff abrasion method are listed. As the electrochemical method, there is a method in which alternating or direct current electrolysis is effected in an electrolyte solution composed of hydrochloric acid or nitric acid. Further, also usable is a method in which mechanical graining is combined with electrochemical graining as described in JP-A No. 54-63,902.

The aluminum plate thus grained is optionally alkali-etched and neutralized and, if desired, is anodized in order to enhance the water retention and wear resistance of the surface. As electrolytes for anodizing the aluminum plate, various electrolytes, which produce porous oxide films, can be used. Generally, the electrolyte solution is composed of sulfuric acid, phosphoric acid, oxalic acid, chromic acid, or a combination of them. The concentration of the electrolyte solution is determined appropriately depending on the kind of the electrolyte.

The treatment conditions for the anodization can not be generally determined since they variously change depending on an electrolyte solution used, and, in general, appropriately include a concentration of the electrolyte solution from 1 to 80% by weight, a temperature of the electrolyte solution from 5 to 70° C., a current density from 5 to 60 $A/dm^2$, a voltage from 1 to 100V, and an electrolysis time from 10 seconds to 5 minutes. When the amount of the anodized film is less than 1.0 $g/m^2$, printing resistance is so poor that the non-image portions are liable to form scratch marks, which collect ink in printing to produce so-called "scratch stains" particularly in the case of a planographic printing plate.

The aluminum plate which has been anodized may be optionally subjected to a hydrophilization treatment. Preferable examples thereof include a method in which the aluminum plate is treated with alkali metal silicates (for example, an aqueous sodium silicate solution) as disclosed in U.S. Pat. Nos. 2,714,066, 3,181,461, 3,280,734, and 3,902,734. In this method, the substrate is immersed or electrolytically treated in an aqueous sodium silicate solution. Further examples include a method in which the surface is treated with an aqueous solution of potassium fluorozirconate as described in JP-B No. 36-22,063 and a method in which the surface is treated with an aqueous solution of polyvinylsulfonic aicd as described in U.S. Pat. Nos. 3,276,868, 4,153,461, and 4,689,272.

[Others]

Prior to the application of an image recording material of the present invention, a primer layer may be formed on the substrate, if necessary.

For example, an organic compound used in the primer layer is selected from carboxymethyl cellulose; dextrin; gum arabic, organic phosphonic acids which may be substituted, such as phosphonic acids having an amino group (for example, 2-aminoethylphophonic acid), phenylphosphonic acid, naphthylphosphonic acid, alkylphosphonic acid, glycerophosphonic acid, methylenediphosphonic acid, and ethylenediphosphonic acid; organic phosphoric acids which may be substituted, such as phenylphosphoric acid, naphthylphosphoric acid, alkylphosphoric acid, and glycerophosphoric acid; organic phosphinic acids which may be substituted, such as phenylphosphinic acid, naphthylphosphinic acid, alkylphosphinic acid, and glycerophosphinic acid; amino acids such as glycine and β-alanine; and hydrochlorides of amines having a hydroxyl group, such as hydrochloride of triethanolamine. They can be used alone or in combination of two or more. Further, the diazonium compound described previously may also be used as a primer layer.

The amount coated of the organic primer layer is suitably from 2 to 200 $mg/m^2$, and preferably from 5 to 100 $mg/m^2$. When the amount coated is less than 2 $mg/m^2$, sufficient film properties cannot be obtained. Further, when it is over 200 $mg/m^2$, the same phenomenon occurs.

This organic primer layer can be made according to the following methods. Namely, there are a method in which a solution obtained by dissolving the above-described organic compound in water or an organic solvent such as methanol, ethanol, methyl ethyl ketone and the like or a mixed solvent thereof is applied on an aluminum plate and dried, and a method in which an aluminum plate is immersed into a solution obtained by dissolving the above-described organic compound in water or an organic solvent such as methanol, ethanol, methyl ethyl ketone and the like or a mixed solvent thereof, for adsorption of the above-described organic compound, then the plate is washed with water and the like and dried to give an organic primer layer. In the former method, a solution comprising the above-described organic compound in a concentration from 0.005 to 10% by weight can be applied by various methods. In the latter method, the concentration of the solution is from 0.01 to 20% by weight, and preferably from 0.05 to 5% by weight, and the immersion temperature is from 20 to 90° C., and preferably from 25 to 50° C., and the immersion time is from 0.1 second to 20 minutes, and preferably from 2 seconds to 1 minute. The solution used herein may be used also in the pH range of from 1 to 12 with controlling the pH value with a basic substance such as ammonia, triethylamine, potassium hydroxide or the like and an acidic substance such as hydrochloric acid, phosphoric acid or the like. Further, a yellow dye can also be added to improve reproducibility of tone when the image recording material of the present invention is used as a planographic printing plate.

As heretofore mentioned, a planographic printing plate using the image recording material of the present invention can be produced. Recording on the planographic printing plate can be performed using an infrared laser. Thermal recording by means of an ultraviolet lamp or a thermal head is also possible. In the present invention, it is preferable that the planographic printing plate is exposed image-wise using a solid laser or a semiconductor laser emitting an infrared ray having a wavelength of from 760 to 1200 nm.

In the present invention, a developing treatment may be conducted immediately after exposure. However, a heat treatment may be conducted between the exposure and development. Where the heat treatment is conducted, preferable temperature and time of the treatment are within a range of from 60 to 150° C. for 5 seconds to 5 minutes, respectively. Examples of the heating methods include a method in which the image recording material is heated by contact with a panel heater or a ceramic heater and a method in which the image recording material is heated in a non-contact state by means of a lamp or hot air blow. The laser energy necessary for recording in irradiation can be reduced by this heat treatment.

The planographic printing plate after the heat treatment, which is conducted if necessary, is developed preferably with water or with an alkaline aqueous solution.

When an alkaline aqueous solution is employed, a conventionally known aqueous alkaline solution can be used as a developing solution and also as a replenisher solution for the developing treatment of a planographic printing plate of the present invention. For example, the aqueous alkaline solution is an aqueous solution of an inorganic alkali salt such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. In addition, an organic alkaline substance can also be used for the preparation of the aqueous alkaline solution. Examples of the organic alkaline substance may include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkaline substances are used alone or in a combination of two or more of them.

Among these alkaline substances, a particularly preferred example of the developing solution is an aqueous solution of a silicate such as sodium silicate or potassium silicate. This is because the adjustment of developability of a developing solution is possible by varying the ratio of silicon oxide $SiO_2$ to alkali metal oxide $M_2O$ (M represents an alkali metal), each of which constitutes the silicate, and the concentration of the silicate in the solution. For example, alkali metal silicates described in JP-A No. 54-62,004 and JP-B No. 57-7,427 are effective.

In recent years, particularly in printing plate making and printing industries, automated developing machines for printing plate materials have been widely used for the rationalization and standardization of plate making operations.

The automated developing machine is generally made up of a developing part and a post-treating part, each equipped with a device for transferring a printing plate material and with a tank of treating solution and a spraying device, in which the printing plate material after exposure travels horizontally so that it is subjected to a developing treatment by being sprayed from spray nozzle with treating solutions moved up by pumps. Further, a method in which a printing plate material is immersed in a treating tank filled with a treating solution by means of immersed guide rolls or the like has been known. In the above-mentioned automated treatment, the treatment can be performed by supplying replenisher solutions to the treating solutions in accordance with treated volume and operational time.

In the above-described system, it is known that a large amount of image forming materials can be treated without exchanging the developing solution in the tank for a long period of time by feeding the tank with an aqueous solution (a replenisher solution) having an alkali strength higher than that of the developing solution in the tank. This replenishing system is suitably used also in the present invention.

If necessary, the developing solution and the replenisher solution may contain a surfactant or an organic solvent for such purposes as enhancement or reduction of developability, dispersion of smut from development, and increase of ink compatibility of the image portions of a printing plate. Examples of preferable surfactants include anionic surfactants, cationic surfactants, nonionic surfactants, and amphoteric surfactants. Examples of preferable organic solvents include benzyl alcohol and the like. Other preferable additives are polyethylene glycol or derivatives thereof and polypropylene glycol or derivatives thereof.

Further, if necessary, the developing solution and the replenisher solution may contain such additives as hydroquinone, resorcinol, a reducing agent based on an inorganic salt such as sodium or potassium sulfite or hydrogensulfite, an organic carboxylic acid, a defoaming agent, and an agent to convert hard water into soft water.

Examples of the developing solutions containing these surfactants, organic solvents, reducing agents and the like may include a developing solution which is described in JP-A No. 51-77,401 and comprises benzyl alcohol, an anionic surfactant, an alkaline substance, and water; a developing solution which is described in JP-A No. 53-44,202 and comprises benzyl alcohol, an anionic surfactant and an aqueous solution containing a water-soluble sulfite; and a developing solution which is described in JP-A No. 55-155,355 and comprises an organic solvent having a solubility in water of 10% by weight or less at room temperature, an alkaline substance, and water. These developing solutions are also suitably used in the present invention.

The printing plate, after being developed using the developing solution and the replenisher solution described above, is then subjected to a post-treatment such as a treatment with rinsing water, a treatment with a rinsing solution containing a surfactant or the like, or a treatment with a desensitizing solution containing gum arabic or a starch derivative. A combination of these treatments may be employed as a post-treatment.

Further, a so-called non-reuse process, in which a printing plate material is treated with a substantially unused treating solution, can also be employed.

A planographic printing plate obtained as described above is coated with a desensitizing gum, if desired, and can be provided to a printing process. However, if it is desired to impart a higher level of printing resistance to the printing plate, the printing plate may be subjected to a burning treatment.

When the printing plate undergoes a burning treatment, it is preferable to treat the printing plate with a surface-adjusting solution, which is described in JP-B Nos. 61-2,518 and 55-28,062 and JP-A Nos.62-31,859 and 61-159,655, prior to the burning treatment.

According to these methods, the planographic printing plate is coated with a surface-adjusting solution by means of sponge or absorbent cotton soaked with the solution; the planographic printing plate is immersed in a vat filled with a surface-adjusting solution; or the planographic printing plate is coated with a surface-adjusting solution by means of an automated coater. If the amount coated is homogenized by squeezing or using squeezing rollers after the coating, a better result is obtained. A suitable amount coated of the surface-adjusting solution is generally in a range of from 0.03 to 0.8 mg/m$^2$(dry weight).

The planographic printing plate after being coated with the surface-adjusting solution is dried, if necessary. Then, it is heated at a high temperature by means of a burning processor (for example, Burning Processor BP-1300 manufactured by Fuji Film Co., Ltd.). The temperature and time vary depending on the types of the components constituting the image, but preferable temperature and time are 180 to 300° C. and 1 to 20 minutes, respectively.

After the burning process, the planographic printing plate may be subjected to conventionally employed treatments such as water-rinsing and gum-coating, if necessary. However, if the surface-adjusting solution contains a water-soluble polymeric compound or the like, a so-called desensitizing treatment such as gum-coating may be omitted.

The planographic printing plate obtained by the treatments described above is mounted on an offset printing machine or the like and used for printing a lot of prints.

EXAMPLES

The following examples further illustrate the present invention in detail, but do not limit the scope of the present invention.

Example I

[Synthesis of a Phenol Compound]

Synthesis Example I-1

Synthesis of Compound A-4

P-aminophenol (1 mol), sodium acetate (1 mol), and acetone (1 L) were placed in a flask, and isobutyryl chloride (1 mol) was added dropwise to the flask which was being cooled with ice. After 5 hours, the reaction mixture was poured into ice water to deposit crystals, which were collected by filtration. In this way, a compound A-4 was obtained in 80% yield. The compound A-4 was charcterized by $^1$H NMR, infrared spectrometry, and mass spectrometry.

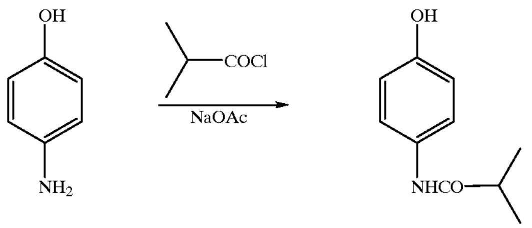

A-4

Synthesis Example I-2

Synthesis of Compound D-3

Tyramine (1 mol) and acetone (1 L) were placed in a flask, and phenyl isocyanate (1 mol) was added dropwise to the flask at room temperature. After 3 hours, the reaction mixture was poured into ice water to deposit crystals, which were collected by filtration. In this way, a compound D-3 was obtained in 85% yield. The compound D-3 was characterized by $^1$H NMR, infrared spectrometry, and mass spectrometry.

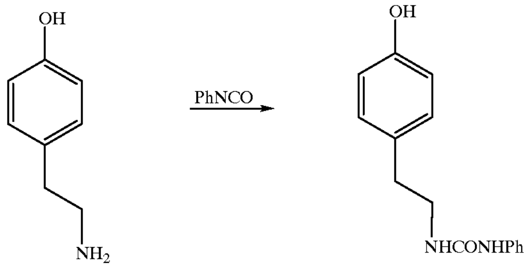

D-3

By conducting processes similar to the above-described process or alternatively by purchase, phenol compounds Z—Y—X—($Ar^1$)—$(OH)_n$, which constitute the general formula I-(1) and are indicated by structures A-1 to S-78 respectively, can be obtained.

Synthesis Example I-3

Synthesis of a Methylol Compound B-3

Tyramine (1 mol), sodium acetate (1 mol), and acetone (1 L) were placed in a flask, and n-valeryl chloride (1 mol) was added dropwise to the flask at room temperature. After 3 hours, the reaction mixture was poured into ice water to deposit crystals, which were collected by filtration. In this way, a compound B-3-X was obtained in 85% yield.

Then, the compound B-3-X (0.85 mol), KOH(0.85 mol), water (500 mL), and a 37% HCHO aqueous solution (5.0 mol) were placed in a flask. After being kept at 50° C. for 5 hours, the reaction mixture was neutralized with acetic acid and concentrated under a reduced pressure. Then, 500 mL of water was added to the concentrated product, and the resultant reaction mixture was extracted with ethyl acetate. The extract was dried with magnesium sulfate. After being dried, the solvent was removed from the extract under a reduced pressure. In this way, a methylol compound B-3 (an oily product) was obtained. The compound B-3 was characterized to have the illustrated B-3 structure by $^1H$ NMR, infrared spectrometry, and mass spectrometry.

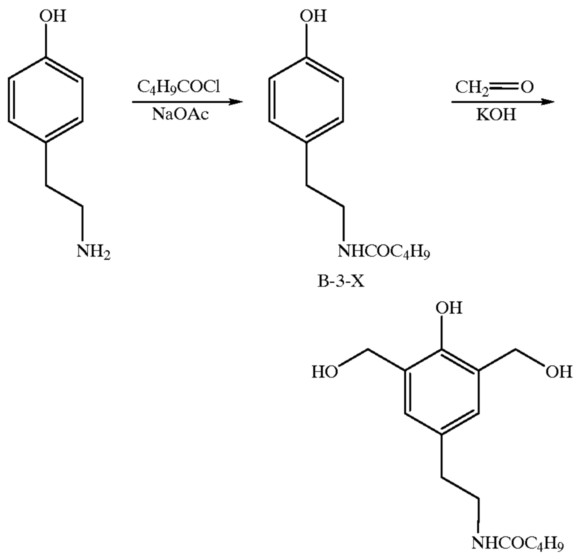

B-3-X

B-3

[Synthesis of a Phenolic Polymer Represented by the General Formula I-(1)]

Synthesis Example I-4

Synthesis of BP-1

The compound A-4 (0.5 mol), m-cresol (0.5 mol), a 37% HCHO aqueous solution (0.8 mol), and oxalic acid (0.002 mol) were placed in a flask and the reaction mixture was refluxed at 130° C. for 6 hours. Then, the reaction mixture was poured into an aqueous solution comprising methanol/water=200/800 mL. The resultant mixture was stirred and subjected to recrystallization. After decantation, the oil layer was poured into 1 L of water. The resultant mixture was stirred and subjected to reprecipitation, followed by drying the precipitate, to obtain a phenolic polymer BP-1. A weight average molecular weight of the phenolic polymer BP-1 was determined by GPC (using polystyrene as a standard substance) to have 4800.

Synthesis Example I-5

Synthesis of BP-2

The procedure of Synthesis Example I-4 was repeated, except that the compound A-4 (0.5 mol) was replaced with the compound D-3 (0.5 mol). In this way, a phenolic polymer BP-2 was obtained. A weight average molecular weight of the phenolic polymer BP-2 was determined by GPC (using polystyrene as a standard substance) to have 6500.

Synthesis Examples I-6 to I-16

Synthesis of BP-3 to BP-13

Phenolic polymers BP-3 to BP-13 were obtained by repeating the procedure of Synthesis Example I-4, except that the compound A-4 (0.5 mol) was replaced with each of the illustrated phenol compounds (0.5 mol each) as shown in Table 10.

The weight average molecular weights of the polymers listed in Table 10 were determined by GPC in the same manner as in the examples described above.

TABLE 10

| | Phenolic polymer represented by the general formula (1) | Illustrated phenol compound | Weight average molecular weight |
|---|---|---|---|
| S.E.* I-6 | BP-3 | B-4 | 5500 |
| S.E.* I-7 | BP-4 | C-5 | 5400 |
| S.E.* I-8 | BP-5 | D-6 | 5500 |
| S.E.* I-9 | BP-6 | E-3 | 4000 |
| S.E.* I-10 | BP-7 | F-1 | 5500 |
| S.E.* I-11 | BP-8 | G-1 | 20000 |
| S.E.* I-12 | BP-9 | S-2 | 4000 |
| S.E.* I-13 | BP-10 | S-7 | 4000 |
| S.E.* I-14 | BP-11 | S-10 | 4200 |
| S.E.* I-15 | BP-12 | S-14 | 8000 |
| S.E.* I-16 | BP-13 | S-33 | 4000 |

S.E.*: Synthesis Example

Synthesis Example I-17

Synthesis of BP-14

The compound D-3 (0.5 mol), phenol (0.5 mol), a 37% HCHO aqueous solution (0.8 mol), and oxalic acid (0.002 mol) were placed in a flask and the reaction mixture was refluxed at 130° C. for 6 hours. Then, the reaction mixture was poured into an aqueous solution comprising methanol/water=200/800 mL. The resultant mixture was stirred and subjected to recrystallization. After decantation, the oil layer was poured into 1 L of water. The resultant mixture was stirred and subjected to reprecipitation, followed by drying the precipitate, to obtain a phenolic polymer BP-14. A weight average molecular weight of the phenolic polymer BP-14 was determined by GPC (using polystyrene as a standard substance) to have 6000.

Synthesis Example I-18

Synthesis of BP-15

The methylol compound B-3 obtained in Synthesis Example I-3 (0.3 mol), phenol (0.5 mol), a 37% HCHO aqueous solution (0.2 mol), and oxalic acid (0.002 mol) were placed in a flask and the reaction mixture was refluxed at 130° C. for 6 hours. Then, the reaction mixture was poured into an aqueous solution comprising methanol/water=200/800 mL. The resultant mixture was stirred and subjected to recrystallization. After decantation, the oil layer was poured into 1 L of water. The resultant mixture was stirred and subjected to reprecipitation, followed by drying the precipitate, to obtain a phenolic polymer BP-15. A weight average molecular weight of the phenolic polymer BP-15 was determined by GPC (using polystyrene as a standard substance)to have 4500.

Synthesis Example I-19

Synthesis of BP-16

The procedure of Synthesis Example I-5 was repeated, except that the 37% HCHO aqueous solution (0.8 mol) was replaced with acetaldehyde (0.8 mol). In this way, a phenolic polymer BP-16 was obtained. A weight average molecular weight of the phenolic polymer BP-16 was determined by GPC (using polystyrene as a standard substance) to have 6000.

Example I-1 to I-16, Comparative Example I-1 to I-3

Negative-type Image Recording Materials

An aluminum plate (material 1050) having a thickness of 0.30 mm was degreased by washing with trichloroethylene. A roughening treatment was applied to the aluminum plate by graining the surface with a nylon and with a suspension in which a 400-mesh powder of pumice was suspended in water, then washed with water. The plate was etched by being immersed in a 25% aqueous solution of sodium hydroxide of 45° C. for 9 seconds and washed with water. The plate was further immersed in a 2% $HNO_3$ for 20 seconds and washed with water. The etching amount of the grained aluminum plate was about 3 g/$m^2$. Then, the plate was subjected to a direct current anodic oxidation by using 7% $H_2SO_4$ as the electrolyte solution and a current density of 15A g/$dm^2$ to provide a film of 3 g/$m^2$ on the surface of the plate. The resulting plate was washed with water and dried. Then, the following primer solution was applied to the aluminum plate, and the plate was dried at 80° C. for 30 seconds. The amount applied after drying was 10 g/$m^2$.

[Primer solution]

| | |
|---|---|
| β-Alanine | 0.10 g |
| Phenylphosphonic acid | 0.05 g |
| Methanol | 40 g |
| Pure water | 60 g |

Then, 19 kinds of solutions [I-α-1] to [I-α-19] were prepared with changing the kind of the phenolic polymer represented by the general formula I-(1) in the present invention or the kind of other polymer for use in Comparative Examples, in the following solution [I-α]. These solutions were respectively applied on aluminum plates which had been primed as described above, then the plates were dried at 100° C. for one minute to give negative-type planographic printing plates [I-α-1] to [I-α-19]. The amount applied after drying was 1.4 g/$m^2$.

Solution [I-α]

| | |
|---|---|
| Cross-linking agent [CR-1] | 0.50 g |
| Phenolic polymer shown in Table 11 | 1.50 g |
| Acid generating agent [SH-3] | 0.20 g |
| Infrared ray absorbing agent absorber [IK-1] | 0.10 g |
| Coloring agent (AIZEN SPILON BLUE C-RH, manufactured by Hodogaya Chemical Co., Ltd.) | 0.015 g |
| Fluorine-containing surfactant (Megafac F-177, manufactured by Dainippon Ink and Chemicals Inc.) | 0.06 g |
| Methyl ethyl ketone | 15 g |
| Methyl alcohol | 7.0 g |

The phenolic polymers used in the solutions [I-α-1] to [I-α-19] are shown in Table 11. The structures of the cross-linking agent [CR-1], the acid generating agent [SH-3], and the infrared ray absorbing agent [IK-1] are given below.

TABLE 11

| | | Phenolic polymer |
|---|---|---|
| Ex.*1 I-1 | [I-α-1] | PB-1 |
| Ex.*1 I-2 | [I-α-2] | PB-2 |
| Ex.*1 I-3 | [I-α-3] | PB-3 |
| Ex.*1 I-4 | [I-α-4] | PB-4 |
| Ex.*1 I-5 | [I-α-5] | PB-5 |
| Ex.*1 I-6 | [I-α-6] | PB-6 |
| Ex.*1 I-7 | [I-α-7] | Phenol novolak/BP-7 = 50/50 wt % |
| Ex.*1 I-8 | [I-α-8] | Phenol novolak/BP-8 = 50/50 wt % |
| Ex.*1 I-9 | [I-α-9] | Phenol novolak/BP-9 = 50/50 wt % |
| Ex.*1 I-10 | [I-α-10] | Phenol novolak/BP-10 = 50/50 wt % |
| Ex.*1 I-11 | [I-α-11] | Phenol novolak/BP-11 = 50/50 wt % |
| Ex.*1 I-12 | [I-α-12] | Phenol novolak/BP-12 = 50/50 wt % |
| Ex.*1 I-13 | [I-α-13] | Phenol novolak/BP-13 = 50/50 wt % |
| Ex.*1 I-14 | [I-α-14] | Phenol novolak/BP-1 = 50/50 wt % |
| Ex.*1 I-15 | [I-α-15] | m/p-cresol novolak/BP-1 = 50/50 wt % |
| Ex.*1 I-16 | [I-α-16] | m/p-cresol novolak/BP-2 = 50/50 wt % |
| C.E.*2 I-1 | [I-α-17] | Phenol novolak |
| C.E.*2 I-2 | [I-α-18] | Polyhydroxystyrene |
| C.E.*2 I-3 | [I-α-19] | m/p-cresol novolak |

Ex.*1: Example
C.E.*2: Comparative Example

Cross-linking [CR-1]

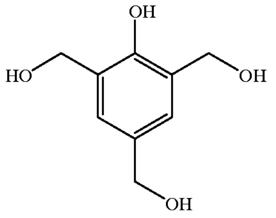

-continued

Acid generating agent [SH-3]

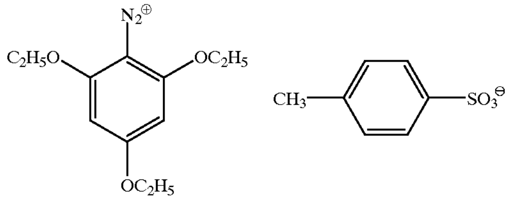

Infrared ray absorbing agent [IK-1]

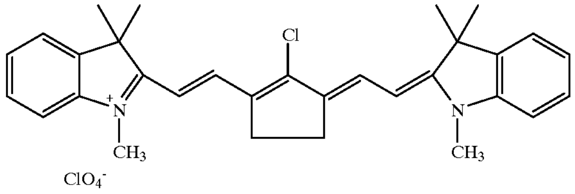

(Evaluation of Sensitivity)

The resulting negative-type planographic printing plates [I-α-1] to [I-α-19] were exposed to a scanning beam of a semiconductor laser emitting infrared rays in the wavelength range of from 830 to 850 nm. After the exposure, the exposed plates were thermally treated at 110° C. for 15 seconds by means of a panel heater and then processed with a developing solution DP-4 manufactured by Fuji Film Co., Ltd. (by dilution with water at a ratio of 1:8). Based on the line width of the image obtained, laser output power, loss of the power in the optical system, and scanning speed, the amount of energy required for recording was calculated. The amount of energy was used as an indicator to express sensitivity.

(Evaluation of Storage Stability)

The above-described printing plates before exposure to laser were left for 3 days under a high humidity condition (75% RH at 45° C.), then exposed in the above-described way, and the amount of energy required for recording was calculated. In this way, the difference between the amounts of energy required before and after the storage under a high humidity condition was calculated. A planographic printing plate, which exhibits a difference of 20 $mJ/cm^2$ or less, is adjudged to be desirable from the standpoint of production and to have good storage stability.

The results are all shown in Table 12.

TABLE 12

| | Negative-type planographic printing plate | Phenolic polymer | Sensitivity ($mJ/cm^2$) | Storage stability ($mJ/cm^2$) |
|---|---|---|---|---|
| Ex.*1 I-1 | [I-α-1] | PB-1 | 160 | 10 |
| Ex.*1 I-2 | [I-α-2] | PB-2 | 160 | 10 |
| Ex.*1 I-3 | [I-α-3] | PB-3 | 170 | 10 |
| Ex.*1 I-4 | [I-α-4] | PB-4 | 160 | 15 |
| Ex.*1 I-5 | [I-α-5] | PB-5 | 170 | 10 |
| Ex.*1 I-6 | [I-α-6] | PB-6 | 180 | 10 |
| Ex.*1 I-7 | [I-α-7] | Phenol novolak/BP-7 = 50/50 wt % | 160 | 10 |
| Ex.*1 I-8 | [I-α-8] | Phenol novolak/BP-8 = 50/50 wt % | 160 | 10 |
| Ex.*1 I-9 | [I-α-9] | Phenol novolak/BP-9 = 50/50 wt % | 170 | 10 |
| Ex.*1 I-10 | [I-α-10] | Phenol novolak/BP-10 = 50/50 wt % | 175 | 10 |
| Ex.*1 I-11 | [I-α-11] | Phenol novolak/BP-11 = 50/50 wt % | 170 | 15 |
| Ex.*1 I-12 | [I-α-12] | Phenol novolak/BP-12 = 50/50 wt % | 180 | 15 |
| Ex.*1 I-13 | [I-α-13] | Phenol novolak/BP-13 = 50/50 wt % | 160 | 10 |
| Ex.*1 I-14 | [I-α-14] | Phenol novolak/BP-1 = 50/50 wt % | 165 | 15 |
| Ex.*1 I-15 | [I-α-15] | m/p-cresol novolak/BP-1 = 50/50 wt % | 170 | 10 |
| Ex.*1 I-16 | [I-α-16] | m/p-cresol novolak/BP-2 = 50/50 wt % | 170 | 10 |
| C.E.*2 I-1 | [I-α-17] | Phenol novolak | 200 | 50 |
| C.E.*2 I-2 | [I-α-18] | Polyhydroxystyrene | 180 | 60 |
| C.E.*2 I-3 | [I-α-19] | m/p-cresol novolak | 250 | 40 |

Note)
Phenol novolak (produced by polycondensation between phenol and formaldehyde and having a weight average molecular weight of 3000)
Polyhydroxystyrene (commercially available Maraka Linker MS4P manufactured by Maruzen Petrochemical Co., Ltd.)
m/p-cresol novolak (produced by polycondensation between m-cresol/p-cresol (at a molar ratio of 60:40) and formaldehyde and having a weight average molecular weight of 5000)
Ex.*1: Example
C.E.*2: Comparative Example As shown in Table 12, the images could be recorded on all of the planographic printing plates of Examples I-1 to I-16 using the phenolic polymers of the present invention with an amount of energy of 200 $mJ/cm^2$ or less. Therefore, it can be understood that these planographic printing plates have higher sensitivity in comparison with the planographic printing plates (Comparative Examples I-1 to I-13) which did not use the phenolic polymers of the present invention. In addition, in the planographic printing plates of Examples I-1 to I-16, the increase of the amount of energy required for exposure of the planographic printing plates after the storage period was slight and therefore the storage stability under a high humidity condition was very good.

On the other hand, the planographic printing plates of Comparative Examples I-1 to I-3, which did not use the phenolic polymers of the present invention, did not exhibit high sensitivity, or did not satisfy the requirement of high sensitivity and storage stability at the same time even if they exhibited high sensitivity because the storage stability was poor.

Examples I-17 to I-32, Comparative Examples I-4 to I-6

Positive-type Planographic Printing Plates

Positive-type planographic printing plates [I-β-1] to [I-β-19] were obtained by repeating the procedures of Examples I-1 to I-16 and Comparative Examples I-1 to I-3, respectively, except that the cross-linking agent [CR-1] and the acid generating agent [SH-3] were eliminated from the solution [I-α].

As in Examples I-1 to I-16 and Comparative Examples I-1 to I-3, the resulting positive-type planographic printing plates [I-β-1] to [I-β-19] were exposed to a scanning beam of a semiconductor laser emitting infrared rays in the wavelength range of from 830 to 850 nm. After the exposure, the exposed plates were processed with a developing solution DP-4 manufactured by Fuji Film Co., Ltd. (by dilution with water at a ratio of 1:8). Based on the line width of the image obtained, laser output power, loss of the power in the optical system, and scanning speed, the amount of energy required for recording was calculated. The amount of energy was used as an indicator to express sensitivity.

In addition, as in Examples I-1 to I-16 and Comparative Examples I-1 to I-3, the difference between the amounts of energy required before and after the storage was calculated for evaluation.

The results are shown in Table 13.

TABLE 13

| | Positive-type planographic printing plates | Sensitivity ($mJ/cm^2$) | Storage stability ($mJ/cm^2$) |
|---|---|---|---|
| Ex.*1 I-17 | [I-β-1] | 120 | 10 |
| Ex.*1 I-18 | [I-β-2] | 120 | 10 |
| Ex.*1 I-19 | [I-β-3] | 115 | 15 |
| Ex.*1 I-20 | [I-β-4] | 115 | 15 |
| Ex.*1 I-21 | [I-β-5] | 120 | 10 |
| Ex.*1 I-22 | [I-β-6] | 120 | 15 |
| Ex.*1 I-23 | [I-β-7] | 115 | 10 |
| Ex.*1 I-24 | [I-β-8] | 120 | 10 |
| Ex.*1 I-25 | [I-β-9] | 120 | 15 |
| Ex.*1 I-26 | [I-β-10] | 125 | 10 |
| Ex.*1 I-27 | [I-β-11] | 130 | 15 |
| Ex.*1 I-28 | [I-β-12] | 130 | 15 |
| Ex.*1 I-29 | [I-β-13] | 125 | 15 |
| Ex.*1 I-30 | [I-β-14] | 120 | 20 |
| Ex.*1 I-31 | [I-β-15] | 135 | 10 |
| Ex.*1 I-32 | [I-β-16] | 125 | 10 |
| C.E.*2 I-4 | [I-β-17] | 165 | 50 |
| C.E.*2 I-5 | [I-β-18] | 150 | 60 |
| C.E.*2 I-6 | [I-β-19] | 180 | 50 |

Ex.*1: Example

C.E.*1: Comparative Example

As shown in Table 13, all of the planographic printing plates of Examples I-17 to I-32 using the phenolic polymers of the present invention had higher sensitivity in comparison with the planographic printing plates (Comparative Examples I-4 to I-6) which did not use the phenolic polymers of the present invention. In addition, in the planographic printing plates of Examples I-7 to I-32, the increase of the amount of energy required for exposure of the planographic printing plates after the storage under a high humidity condition was slight and therefore the storage stability under a high humidity condition was very good. On the other hand, in the planographic printing plates of Comparative Examples I-4 to I-6, the increase of the amount of energy required for exposure of the planographic printing plates after the storage under a high humidity condition was larger and therefore the storage stability was insufficient.

As described above, the planographic printing plates of the present invention, irrespective of negative and positive types, had sensitivity and storage stability enhanced at the same time to a satisfactory level.

Examples II

Synthesis of Binder Polymers

Synthesis Example II-1

Synthesis of Polymer P-1, [a Specific Example of the General Formula II-(2)]

To 100 g of commercially available poly-p-hydroxylstyrene (H-1, having a weight average molecular weight of 20,000) and 30 g of p-tosylisocyanate was added 200 mL of acetone and the reaction mixture was refluxed for 24 hours. Then, the reaction mixture was subjected to a reprecipitation treatment using water. After being washed with a mixture of methanol/water=2/8, the precipitate was collected by filtration and dried. In this way, 120 g of a binder polymer [P-1] was obtained.

The structure of the functional group [M-3] shown in Table 9 was identified by $^1H$ NMR. A weight average molecular weight (Mw) of the binder polymer P-1 thus obtained was determined by GPC (Mw=20,000).

Synthesis Example II-2

Synthesis of P-2, [a Specific Example of the General Formula II-(1)]

To 100 g of commercially available m-cresol novolak (N-2, having a weight average molecular weight of 3000) and 30 g of p-tosylisocyanate was added 200 mL of acetone and the reaction mixture was refluxed for 24 hours. Then, the reaction mixture was subjected to a reprecipitation treatment using water. After being washed with a mixture of methanol/water=2/8, the precipitate was collected by filtration and dried, to obtain 110 g of a binder polymer [P-2].

The structure of the functional group [M-3] shown in Table 9 was identified by $^1H$ NMR. A weight average molecular weight (Mw) of the binder polymer P-2 thus obtained was determined by GPC (Mw=3,000).

(Synthesis Example II-3

Synthesis of P-3, [a Specific Example of the General Formula II-(2)]

The procedure of Synthesis Example II-1 was repeated, except that the poly-p-hydroxylstyrene was replaced with the following polymer (II-F-1, having a weight average molecular weight of 20,000). In this way, 120 g of a binder polymer [P-3] was obtained.

The structure of the functional group [M-3] shown in Table 9 was identified by $^1H$ NMR. A weight average molecular weight (Mw) of the binder polymer P-3 thus obtained was determined by GPC (Mw=20,000).

II-F-1

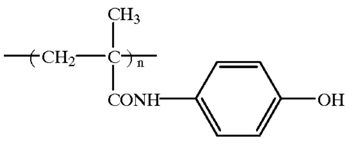

Synthesis Example II-4

Synthesis of P-4, [a Specific Example of the General Formula II-(2)]

The procedure of Synthesis Example II-1 was repeated, except that the poly-p-hydroxylstyrene was replaced with the following polymer (II-F-2, having a weight average molecular weight of 15000). In this way, 115 g of a binder polymer [P-4] was obtained.

The structure of the functional group [M-3] shown in Table 9 was identified by $^1$H NMR. A weight average molecular weight (Mw) of the binder polymer P-4 thus obtained was determined by GPC (Mw=15,000).

II-F-2

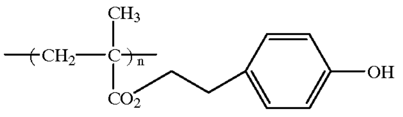

Synthesis Example II-5

Synthesis of P-5, [a Specific Example of the General Formula II-(1)]

To 100 g of phenol/formaldehyde novolak (N-1, having a weight average molecular weight of 1500) and 30 g of phenylisocyanate were added 50 g of triethylamine and 200 mL of acetone and the reaction mixture was refluxed for 24 hours. Then, the pH value of the reaction mixture was adjusted to 2 by dilute hydrochloric acid and the reaction mixture was subjected to a reprecipitation treatment using water. After being washed with a mixture of methanol/water=4/6, the precipitate was collected by filtration and dried. In this way, 125 g of a binder polymer [P-5] was obtained.

The structure of the functional group [M-3] shown in Table 9 was identified by $^1$H NMR. A weight average molecular weight (Mw) of the binder polymer P-5 thus obtained was determined by GPC (Mw=1,500).

Synthesis Example II-6

Synthesis of P-6, [a Specific Example of the General Formula II-(1)]

The procedure of Synthesis Example II-5 was repeated, except that the phenylisocyanate was replaced with butylisocyanate. In this way, 115 g of a binder polymer [P-6] was obtained.

The structure of the —CO—NH-nBu group was identified by $^1$H NMR. A weight average molecular weight (Mw) of the binder polymer P-6 thus obtained was determined by GPC (Mw=1,500).

Synthesis Example II-7

Synthesis of P-7, [a Specific Example of the General Formula II-(1)]

The procedure of Synthesis Example II-5 was repeated, except that the phenylisocyanate therein used was replaced with benzylisocyanate. In this way, 100 g of a binder polymer [P-7] was obtained.

The structure of the —CO—NH—CO—$C_6H_5$ was identified by $^1$H NMR. A weight average molecular weight (Mw) of the binder polymer P-7 thus obtained was determined by GPC (Mw=1,500).

Example II-1 to I-14, Comparative Example II-1 to II-5

Negative Type

An aluminum plate (material 1050) having a thickness of 0.30 mm was degreased by washing with trichloroethylene. A roughening treatment was applied to the aluminum plate by graining the surface with a nylon and with a suspension in which a 400-mesh powder of pumice was suspended in water, then washed with water. The plate was etched by being immersed in a 25% aqueous solution of sodium hydroxide at 45° C. for 9 seconds and washed with water. The plate was further immersed in a 2% $HNO_3$ for 20 seconds and washed with water. The etching amount of the grained aluminum plate was about 3 g/m$^2$. Then, the plate was subjected to a direct current anodic oxidation by using 7% $H_2SO_4$ as the electrolyte solution and a current density of 15 A g/dm$^2$, to provide a film on the surface of the plate. The resulting plate was washed with water and dried. Then, the following primer solution was applied to the aluminum plate, and the plate was dried at 80° C. for 30 seconds. The amount applied after drying was 10 g/m$^2$.

[Primer solution]

| | |
|---|---|
| β-Alanine | 0.10 g |
| Phenylphosphonic acid | 0.05 g |
| Methanol | 40 g |
| Pure water | 60 g |

Then, 19 kinds of solutions [II-α-1] to [II-α-19] were prepared with changing the kind of the binder polymer in the present invention or the kind of other polymer for use in Comparative Examples, in the following solution [II-α]. These solutions were respectively applied on aluminum plates which had been primed as described above, then the plates were dried at 100° C. for one minute to give negative-type planographic printing plates [II-α-1] to [II-α-19]. The amount applied after drying was 1.4 g/m$^2$.

Solution [II-α]

| | |
|---|---|
| Cross-linking agent [CR-1] | 0.50 g |
| Binder polymer shown in Table 14 | 1.50 g |
| Acid generating agent [SH-3] | 0.20 g |
| Infrared ray absorbing agent absorber [IK-1] | 0.10 g |
| Coloring agent (AIZEN SPILON BLUE C-RH, manufactured by Hodogaya Chemical Co., Ltd.) | 0.015 g |
| Fluorine-containing surfactant (Megafac F-177, manufactured by Dainippon Ink and Chemicals Inc.) | 0.06 g |
| Methyl ethyl ketone | 15 g |
| Methyl alcohol | 7.0 g |

The binder polymers used in the solutions [II-α-1] to [II-α-19] are shown in Table 14. The structures of the cross-linking agent [CR-1], the acid generating agent [SH-3], and the infrared ray absorbing agent [IK-1] are given below.

TABLE 14

| | Planographic printing plates | Binder polymer |
|---|---|---|
| Ex.*[1] II-1 | [II-α-1] | P-1 |
| Ex.*[1] II-2 | [II-α-2] | P-2 |
| Ex.*[1] II-3 | [II-α-3] | P-3 |
| Ex.*[1] II-4 | [II-α-4] | P-4 |
| Ex.*[1] II-5 | [II-α-5] | P-5 |
| Ex.*[1] II-6 | [II-α-6] | P-6 |
| Ex.*[1] II-7 | [II-α-7] | P-7 |
| Ex.*[1] II-8 | [II-α-8] | P-1/II-F-1 = 50/50 wt % |
| Ex.*[1] II-9 | [II-α-9] | P-1/II-F-2 = 50/50 wt % |
| Ex.*[1] II-10 | [II-α-10] | P-3/N-1 = 50/50 wt % |
| Ex.*[1] II-11 | [II-α-11] | P-4/N-2 = 50/50 wt % |
| Ex.*[1] II-12 | [II-α-12] | P-5/II-H-1 = 50/50 wt % |
| Ex.*[1] II-13 | [II-α-13] | P-6/II-H-1 = 50/50 wt % |
| Ex.*[1] II-14 | [II-α-14] | P-7/II-H-1 = 50/50 wt % |
| C.E.*[2] II-1 | [II-α-15] | Phenol/formaldehyde novolak (N-1) |
| C.E.*[2] II-2 | [II-α-16] | m-cresol/formaldehyde novolak (N-2) |
| C.E.*[2] II-3 | [II-α-17] | poly-p-hydroxystyrene (II-H-1) |
| C.E.*[2] II-4 | [II-α-18] | II-F-1 |
| C.E.*[2] II-5 | [II-α-19] | II-F-2 |

Ex.*[1]: Example
C.E.*[2]: Comparative Example

Cross-linking agent [CR-1]

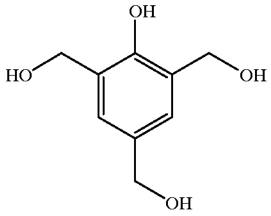

-continued

Acid generating agent [SH-3]

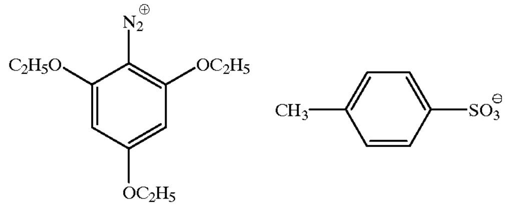

Infrared ray absorbing agent [IK-1]

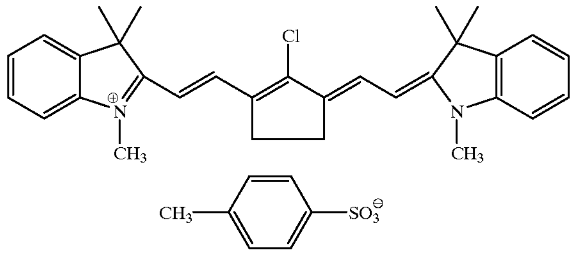

(Evaluation of Sensitivity)

The sensitivity of the resulting negative-type planographic printing plates [II-α-1] to [II-α-19] was evaluated in the same manner as the evaluation of the negative-type planographic printing plates [I-α-1] to [I-α-19].

(Evaluation of Storage Stability)

The storage stability of the resulting negative-type planographic printing plates [II-α-1] to [II-α-19] was evaluated in the same manner as the evaluation of the negative-type planographic printing plates [I-α-1] to [I-α-19].

The results are all shown in Table 15.

TABLE 15

| | Negative-type planographic printing plates | Binder polymer | Sensitivity ($mJ/cm^2$) | Storage stability ($mJ/cm^2$) |
|---|---|---|---|---|
| Ex.*[1] II-1 | [II-α-1] | P-1 | 150 | 10 |
| Ex.*[1] II-2 | [II-α-2] | P-2 | 160 | 10 |
| Ex.*[1] II-3 | [II-α-3] | P-3 | 150 | 10 |
| Ex.*[1] II-4 | [II-α-4] | P-4 | 150 | 15 |
| Ex.*[1] II-5 | [II-α-5] | P-5 | 145 | 10 |
| Ex.*[1] II-6 | [II-α-6] | P-6 | 150 | 10 |
| Ex.*[1] II-7 | [II-α-7] | P-7 | 140 | 15 |
| Ex.*[1] II-8 | [II-α-8] | P-1/II-F-1 = 50/50 wt % | 150 | 15 |
| Ex.*[1] II-9 | [II-α-9] | P-1/II-F-2 = 50/50 wt % | 145 | 20 |
| Ex.*[1] II-10 | [II-α-10] | P-3/N-1 = 50/50 wt % | 145 | 20 |
| Ex.*[1] II-11 | [II-α-11] | P-4/N-2 = 50/50 wt % | 150 | 10 |
| Ex.*[1] II-12 | [II-α-12] | P-5/II-H-1 = 50/50 wt % | 150 | 10 |
| Ex.*[1] II-13 | [II-α-13] | P-6/II-H-1 = 50/50 wt % | 160 | 10 |
| Ex.*[1] II-14 | [II-α-14] | P-7/II-H-1 = 50/50 wt % | 145 | 10 |
| C.E.*[2] II-1 | [II-α-15] | Phenol/formaldehyde novolak (N-1) | 190 | 40 |
| C.E.*[2] II-2 | [II-α-16] | m-cresol/formaldehyde novolak (N-2) | 200 | 50 |
| C.E.*[2] II-3 | [II-α-17] | poly-p-hydroxystyrene (II-H-1) | 190 | 50 |
| C.E.*[2] II-4 | [II-α-18] | II-F-1 | 180 | 50 |
| C.E.*[2] II-5 | [II-α-19] | II-F-2 | 160 | 60 |

Ex.*[1]: Example
C.E.*[2]: Comparative Example

As shown in Table 15, the images could be recorded on all of the planographic printing plates of Examples II-1 to II-14 using the binder polymers of the present invention with an amount of energy of 160 mJ/cm$^2$ or less. Therefore, it can be understood that these planographic printing plates have higher sensitivity in comparison with the planographic printing plates (Comparative Examples II-1 to II-5) which did not use the binder polymers of the present invention. In addition, in the planographic printing plates of Examples II-1 to II-14, the increase of the amount of energy required for exposure of the planographic printing plates after the storage period was slight and therefore the storage stability under a high humidity condition was very good.

On the other hand, the planographic printing plates of Comparative Examples II-1 to II-5, which did not use the binder polymers of the present invention, did not exhibit high sensitivity, or did not satisfy the requirement of high sensitivity and storage stability at the same time even if they exhibited high sensitivity because the storage stability was poor.

Examples II-15 to II-28, Comparative Examples II-6 to II-10

Positive Type

Positive-type planographic printing plates [II-β1] to [II-β-19] were obtained by repeating the procedures of Examples II-1 to II-14 and Comparative Examples II-1 to II-5, respectively, except that the cross-linking agent [CR-1] and the acid generating agent [SH-3] were eliminated from the solution [II-α].

As in Examples II-1 to II-14 and Comparative Examples II-1 to II-5, the resulting positive-type planographic printing plates [II-β-1] to [II-β-19] were exposed to a scanning beam of a semiconductor laser emitting infrared rays in the wavelength range of from 830 to 850 nm. After the exposure, the exposed plates were processed with a developing solution DP-4 manufactured by Fuji Film Co., Ltd. (by dilution with water at a ratio of 1:8). Based on the line width of the image obtained, laser output power, loss of the power in the optical system, and scanning speed, the amount of energy required for recording was calculated. The amount of energy was used as an indicator to express sensitivity.

In addition, as in Examples II-1 to II-14 and Comparative Examples II-1 to II-5, the difference between the amounts of energy required before and after the storage was calculated for evaluation.

The results are shown in Table 16.

TABLE 16

| | Positive-type planographic printing plates | Binder polymer | Sensitivity (mJ/cm$^2$) | Storage stability (mJ/cm$^2$) |
|---|---|---|---|---|
| Ex.*1 II-15 | [II-β-1] | P-1 | 110 | 10 |
| Ex.*1 II-16 | [II-β-2] | P-2 | 115 | 10 |
| Ex.*1 II-17 | [II-β-3] | P-3 | 120 | 10 |
| Ex.*1 II-18 | [II-β-4] | P-4 | 115 | 15 |
| Ex.*1 II-19 | [II-β-5] | P-5 | 115 | 15 |
| Ex.*1 II-20 | [II-β-6] | P-6 | 120 | 10 |
| Ex.*1 II-21 | [II-β-7] | P-7 | 115 | 10 |
| Ex.*1 II-22 | [II-β-8] | P-1/II-F-1 = 50/50 wt % | 115 | 10 |
| Ex.*1 II-23 | [II-β-9] | P-1/II-F-2 = 50/50 wt % | 120 | 15 |
| Ex.*1 II-24 | [II-β-10] | P-3/N-1 = 50/50 wt % | 125 | 10 |
| Ex.*1 II-25 | [II-β-11] | P-4/N-2 = 50/50 wt % | 120 | 10 |
| Ex.*1 II-26 | [II-β-12] | P-5/II-H-1 = 50/50 wt % | 125 | 10 |
| Ex.*1 II-27 | [II-β-13] | P-6/II-H-1 = 50/50 wt % | 115 | 10 |
| Ex.*1 II-28 | [II-β-14] | P-7/II-F-1 = 50/50 wt % | 120 | 15 |
| C.E.*2 II-6 | [II-β-15] | N-1 | 150 | 60 |
| C.E.*2 II-7 | [II-β-16] | N-2 | 170 | 70 |
| C.E.*2 II-8 | [II-β-17] | II-H-1 | 160 | 50 |
| C.E.*2 II-9 | [II-β-18] | II-F-1 | 180 | 60 |
| C.E.*2 II-10 | [II-β-19] | II-F-2 | 150 | 50 |

Ex.*1: Example
C.E.*1 : Comparative Example

As shown in Table 16, all of the planographic printing plates of Examples II-15 to II-28 using the binder polymers of the present invention had higher sensitivity in comparison with the planographic printing plates (Comparative Examples II-6 to II-10) which did not use the binder polymers of the present invention. In addition, in the planographic printing plates of Examples II-15 to I-28, the increase of the amount of energy required for exposure of the planographic printing plates after the storage under a high humidity condition was slight and therefore the storage stability under a high humidity condition was very good. On the other hand, in the planographic printing plates of Comparative Examples II-6 to II-10, the increase of the amount of energy required for exposure of the planographic printing plates after the storage under a high humidity condition was larger and therefore the storage stability was insufficient.

As described above, the planographic printing plates of the present invention, irrespective of negative and positive types, had sensitivity and storage stability enhanced at the same time to a satisfactory level.

What is claimed is:

1. An image recording material comprising a phenolic polymer, which has on a polymer backbone at least a structural unit represented by the following general formula I-(1) and has a molecular weight of 1,000 or more, and an infrared ray absorbing agent,

I-(1)

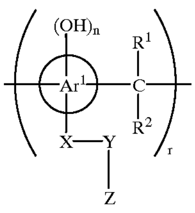

wherein $Ar^1$ represents an aromatic hydrocarbon ring which may have a substituent group; each of $R^1$ and $R^2$, which may be the same or different, represents a hydrogen atom or a hydrocarbon group having 12 or less carbon atoms; n is an integer of 1 to 3; r is an integer chosen in accordance with the molecular weight; X represents a single bond or a divalent hydrocarbon linking group, which may have a substituent group, selected from the group consisting of a linear alkylene group having 1 to 18 carbon atoms, a linear, branched, or cyclic alkenylene group having 2 to 18 carbon atoms, an alkynylene group having 2 to 8 carbon atoms, and an arylene group having 6 to 20 carbon atoms; Y represents either a di- to quadrivalent linking group having at least one partial structure selected from the following $Y^1$ groups; and Z represents either a mono- to quadrivalent linking group or a terminal group when Y is a linking group:

$Y^1$:

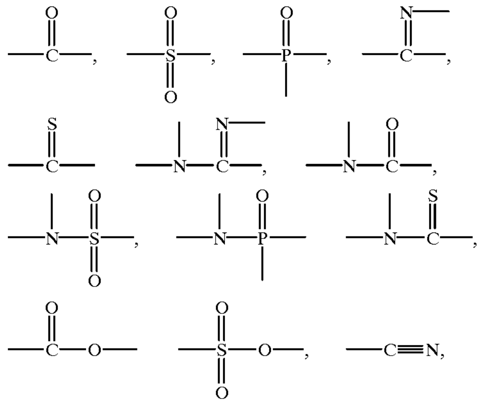

and

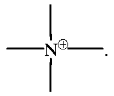

2. A planographic printing plate comprising a substrate having thereon a photosensitive layer comprised of the image recording material according to claim 1.

3. A photosensitive resin composition comprising a polymer which has at least a structural unit represented by the following general formula II-(1) as a polymer backbone or a structural unit represented by the following general formula II-(2) as a side chain linked to a polymer backbone and further a phenolic hydroxyl group,

II-(1)

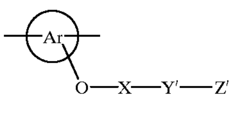

-continued

II-(2)

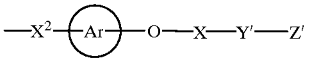

wherein Ar represents an aromatic hydrocarbon ring which may have a substituent group; X represents a divalent linking group; Y' represents a divalent linking group having at least one partial structure selected from the following $Y'^1$ groups; Z' represents a monovalent terminal group; and $X^2$ represents a single bond or a divalent linking group which contains one or more atoms selected from the group consisting of C, H, N, O, and S and which has 20 or less carbon atoms:

$Y'^1$:

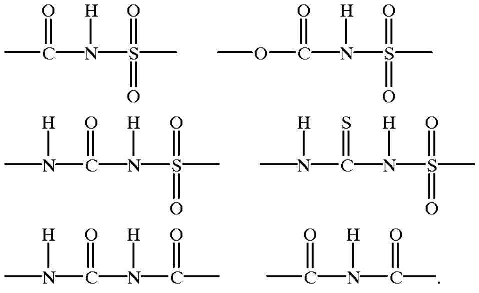

4. A photosensitive resin composition according to claim 3 which further comprises an infrared ray absorbing agent.

5. A planographic printing plate comprising a substrate having thereon a photosensitive layer comprised of the photosensitive resin composition according to claim 4.

6. A planographic printing plate comprising a substrate having thereon a photosensitive layer comprised of the photosensitive resin composition according to claim 3.

7. A photosensitive resin composition comprising a polymer, which has at least a structural unit represented by the following general formula II-(1) as a polymer backbone or a structural unit represented by the following general formula II-(2) as a side chain linked to a polymer backbone, and a polymer which has a phenolic hydroxyl group,

II-(1)

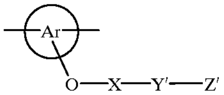

II-(2)

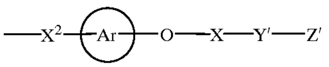

wherein Ar represents an aromatic hydrocarbon ring which may have a substituent group; X represents a divalent linking group; Y' represents a divalent linking group having at least one partial structure selected from the following $Y'^1$ groups; Z' represents a monovalent terminal group; and $X^2$ represents a single bond or a divalent linking group which contains one or more atoms selected from the group consisting of C, H, N, O, and S and which has 20 or less carbon atoms:

Y'[1]:

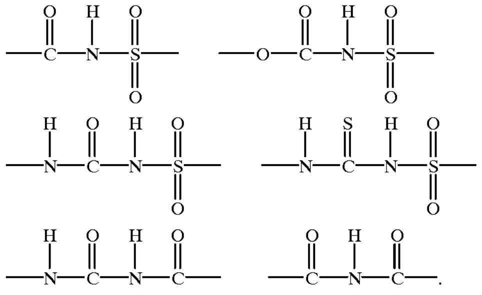

8. A photosensitive resin composition according to claim 7 which further comprises an infrared ray absorbing agent.

9. A planographic printing plate comprising a substrate having thereon a photosensitive layer comprised of the photosensitive resin composition according to claim 8.

10. A planographic printing plate comprising a substrate having thereon a photosensitive layer comprised of the photosensitive resin composition according to claim 7.

* * * * *